(12) United States Patent
Yoo et al.

(10) Patent No.: US 12,457,747 B2
(45) Date of Patent: Oct. 28, 2025

(54) SEMICONDUCTOR DEVICE AND DATA STORAGE SYSTEM INCLUDING THE SAME

(71) Applicant: SAMSUNG ELECTRONICS CO., LTD., Suwon-si (KR)

(72) Inventors: Hyemin Yoo, Suwon-si (KR); Woosung Yang, Hwaseong-si (KR); Sukkang Sung, Seongnam-si (KR); Ahreum Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 706 days.

(21) Appl. No.: 17/715,508

(22) Filed: Apr. 7, 2022

(65) Prior Publication Data

US 2023/0005947 A1 Jan. 5, 2023

(30) Foreign Application Priority Data

Jul. 2, 2021 (KR) .......................... 10-2021-0086936

(51) Int. Cl.
*H10B 43/40* (2023.01)
*H01L 23/528* (2006.01)
*H01L 23/535* (2006.01)
*H10B 43/27* (2023.01)

(52) U.S. Cl.
CPC ......... *H10B 43/40* (2023.02); *H01L 23/5283* (2013.01); *H01L 23/535* (2013.01); *H10B 43/27* (2023.02)

(58) Field of Classification Search
None
See application file for complete search history.

(56) References Cited

U.S. PATENT DOCUMENTS

| | | | |
|---|---|---|---|
| 9,165,937 B2 | 10/2015 | Yip et al. | |
| 9,224,747 B2 | 12/2015 | Mizutani et al. | |
| 9,424,928 B2 | 8/2016 | Hwang et al. | |
| 9,515,084 B2 | 12/2016 | Oh et al. | |
| 10,446,575 B2 | 10/2019 | Kim et al. | |
| 2017/0141032 A1* | 5/2017 | Lee ..................... | H01L 23/5226 |
| 2017/0287833 A1* | 10/2017 | Thimmegowda ...... | H10B 43/50 |
| 2019/0051655 A1* | 2/2019 | Lee ......................... | H10B 43/35 |
| 2019/0139977 A1 | 5/2019 | Lee | |
| 2019/0139978 A1* | 5/2019 | Kim ....................... | H10B 43/27 |

(Continued)

*Primary Examiner* — Steven B Gauthier
*Assistant Examiner* — E. Rhett Cheek
(74) *Attorney, Agent, or Firm* — Muir Patent Law, PLLC

(57) ABSTRACT

A semiconductor device includes a first structure having first and second memory regions, an extension region therebetween, and word lines; and a second structure having a circuit region overlapping the extension region. The word lines include first and second common word lines at different levels, and first and second intermediate individual word lines at a same level and spaced apart. Each of the first and second common word lines are in the first and second memory regions and the extension region. The first intermediate individual word line is in the first memory region and extends into the extension region at a level between the first and second common word lines. The second intermediate individual word line is in the second memory region and extends into the extension region. The circuit region includes pass transistors connected to the word lines. A pass transistor overlaps the word lines in the extension region.

20 Claims, 36 Drawing Sheets

(56) References Cited

U.S. PATENT DOCUMENTS

| | | | |
|---|---|---|---|
| 2019/0237477 A1* | 8/2019 | Baek | H10B 43/27 |
| 2020/0135749 A1* | 4/2020 | Hwang | H01L 23/535 |
| 2021/0091100 A1* | 3/2021 | Takekida | H10B 41/35 |
| 2021/0183770 A1* | 6/2021 | Kim | H10B 43/35 |
| 2021/0335727 A1* | 10/2021 | Takekida | H10B 43/27 |
| 2021/0391257 A1* | 12/2021 | Nguyen | H10B 41/35 |
| 2022/0208775 A1* | 6/2022 | Zhang | H10B 43/35 |
| 2024/0147727 A1* | 5/2024 | Xu | H01L 23/5283 |

* cited by examiner

SEMICONDUCTOR DEVICE AND DATA STORAGE SYSTEM INCLUDING THE SAME

CROSS-REFERENCE TO RELATED APPLICATION

This application claims benefit of priority to Korean Patent Application No. 10-2021-0086936, filed on Jul. 2, 2021, in the Korean Intellectual Property Office, the disclosure of which is incorporated herein by reference in its entirety.

BACKGROUND

1. Field

Embodiments relate to a semiconductor device and a data storage system including the same.

2. Description of the Related Art

In an electronic system requiring data storage, a semiconductor device capable of storing high-capacity data may be required. Accordingly, methods for increasing data storage capacity of semiconductor devices are being researched. For example, as a method for increasing data storage capacity of a semiconductor device, a semiconductor device including memory cells arranged three-dimensionally, instead of memory cells arranged two-dimensionally, has been proposed.

SUMMARY

Embodiments are directed to a semiconductor device, including: a first structure having a first memory region, a second memory region, and an extension region between the first and second memory regions, and including word lines spaced apart from each other; and a second structure having a circuit region overlapping the extension region in a vertical direction, wherein the word lines include first and second common word lines disposed on different height levels, and first and second intermediate individual word lines disposed on the same height level and spaced apart from each other, wherein each of the first and second common word lines are disposed in the first memory region, the extension region, and the second memory region, the first intermediate individual word line is disposed in the first memory region and extends into the extension region on a height level between the first common word line and the second common word line, the second intermediate individual word line is disposed in the second memory region and extends into the extension region on the same height level as the first intermediate individual word line, the circuit region including pass transistors electrically connected to the word lines, wherein the pass transistors include common transistors and individual transistors, wherein at least one of the common transistors and at least one of the individual transistors overlap the word lines in the extension region.

Embodiments are directed to a semiconductor device, including: a first structure having a first memory region, a second memory region, and an extension region between the first and second memory regions; and a second structure including a circuit region overlapping the extension region in a vertical direction, wherein the first structure includes first lower common gate electrodes disposed in the first and second memory regions and the extension region and spaced apart from each other in the vertical direction; first intermediate individual gate electrodes disposed in the first memory region, extending into the extension region, disposed on a higher level than the first lower common gate electrodes, and spaced apart from each other in the vertical direction; second intermediate individual gate electrodes disposed in the second memory region, extending into the extension region, disposed on the same height level as the first intermediate individual gate electrodes, and spaced apart from the first intermediate individual gate electrodes in the extension region; first upper common gate electrodes disposed in the first and second memory regions and the extension region and spaced apart from each other in the vertical direction; first upper individual gate electrodes disposed in the first memory region, extending into the extension region, disposed on a higher level than the first upper common gate electrodes, and spaced apart from each other in the vertical direction; second upper individual gate electrodes disposed in the second memory region, extending into the extension region, disposed on a higher level than the first upper common gate electrodes, and spaced apart from each other in the vertical direction; a first vertical memory structure passing through the first lower common gate electrodes, the first intermediate individual gate electrodes, the first upper common gate electrodes, and the first upper individual gate electrodes in the first memory region; and a second vertical memory structure passing through the first lower common gate electrodes, the second intermediate individual gate electrodes, the first upper common gate electrodes, and the second upper individual gate electrodes in the second memory region, wherein the first structure includes a plurality of pad regions spaced apart from each other, wherein at least one of the plurality of pad regions has a step shape lowering gradually and then rising gradually in a direction from the first memory region toward the second memory region, and the plurality of pad regions include a first lower common pad region including pads of the first lower common gate electrodes, a first intermediate individual pad region including pads of the first intermediate individual gate electrodes, a first upper common pad region including pads of the first upper common gate electrodes; and a first upper individual pad region including pads of the first upper individual gate electrodes.

Embodiments are directed to a data storage system, including: a semiconductor device including an input/output pad; and a controller electrically connected to the semiconductor device through the input/output pad and controlling the semiconductor device, wherein the semiconductor device includes a first structure having a first memory region, a second memory region, and an extension region between the first and second memory regions, and including word lines spaced apart from each other; and a second structure having a circuit region overlapping the extension region in a vertical direction, wherein the word lines include first and second common word lines disposed on different height levels, and first and second intermediate individual word lines disposed on the same height level and spaced apart from each other, wherein each of the first and second common word lines are disposed in the first memory region, the extension region, and the second memory region, the first intermediate individual word line is disposed in the first memory region and extends into the extension region on a height level between the first common word line and the second common word line, the second intermediate individual word line is disposed in the second memory region and extends into the extension region on the same height level as the first intermediate individual word line, the circuit region including pass transistors electrically connected to the word lines, wherein the pass transistors include common transistors and individual transistors, wherein at least one of the common transistors and at least one of the individual transistors overlap the word lines in the extension region.

BRIEF DESCRIPTION OF DRAWINGS

Features will become apparent to those of skill in the art by describing in detail example embodiments with reference to the attached drawings in which.

DETAILED DESCRIPTION

Hereinafter, terms such as "upper," "intermediate," and "lower" may also be used to be replaced with other terms, for example, "first," "second," and "third," to describe the elements of the specification. Terms such as "first," "second," and "third" may be used to describe various components, but the components are not limited by the terms. A "first component" may be called a "second component," or may be known by another term, distinguishable from other components.

First, an example of a semiconductor device according to an example embodiment will be described with reference to FIGS. 1, 2A, 2B, and 3.

Figure 1:
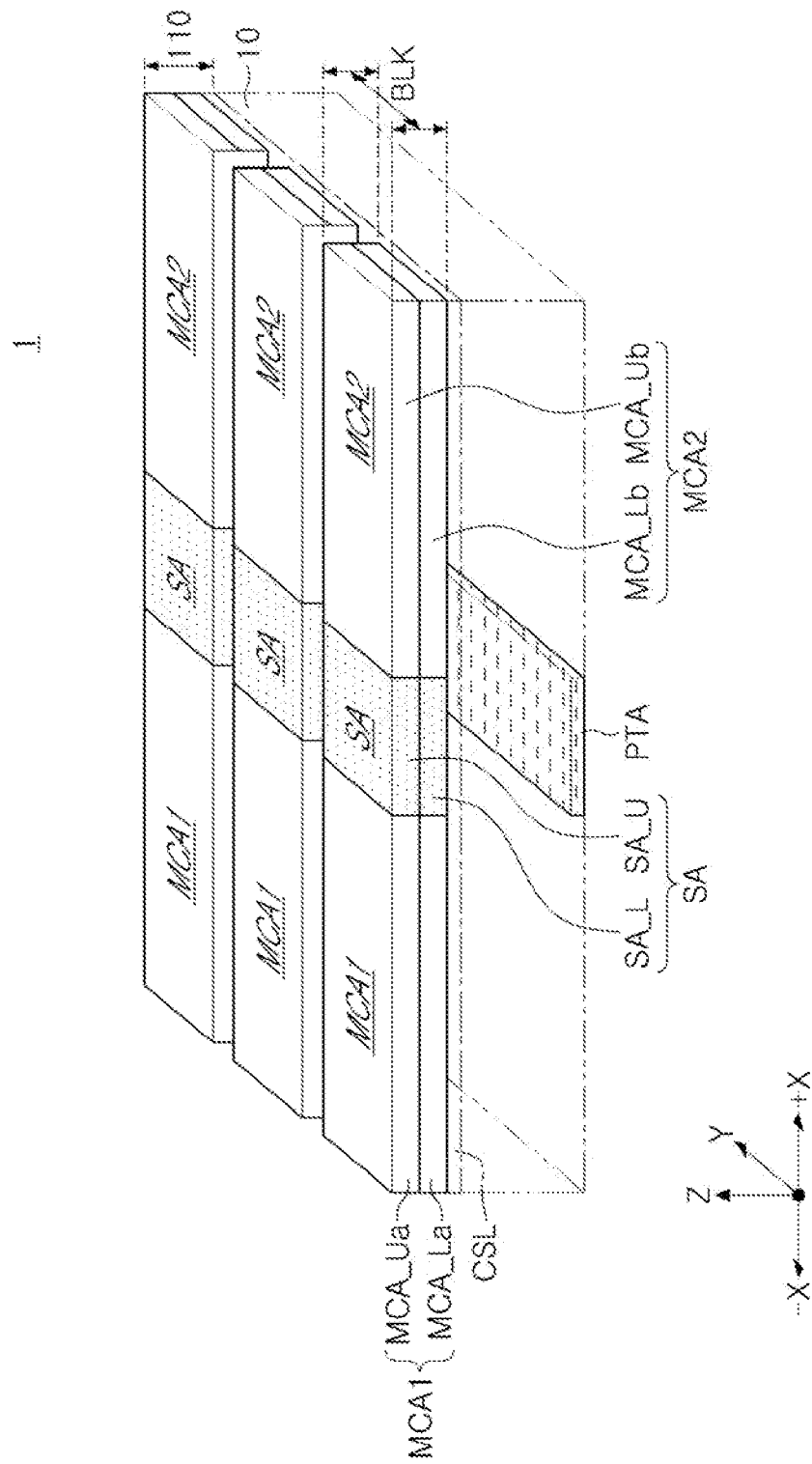
FIGS. 1, 2A, and 2B are views conceptually illustrating a semiconductor device according to an example embodiment.
Figure 2A:
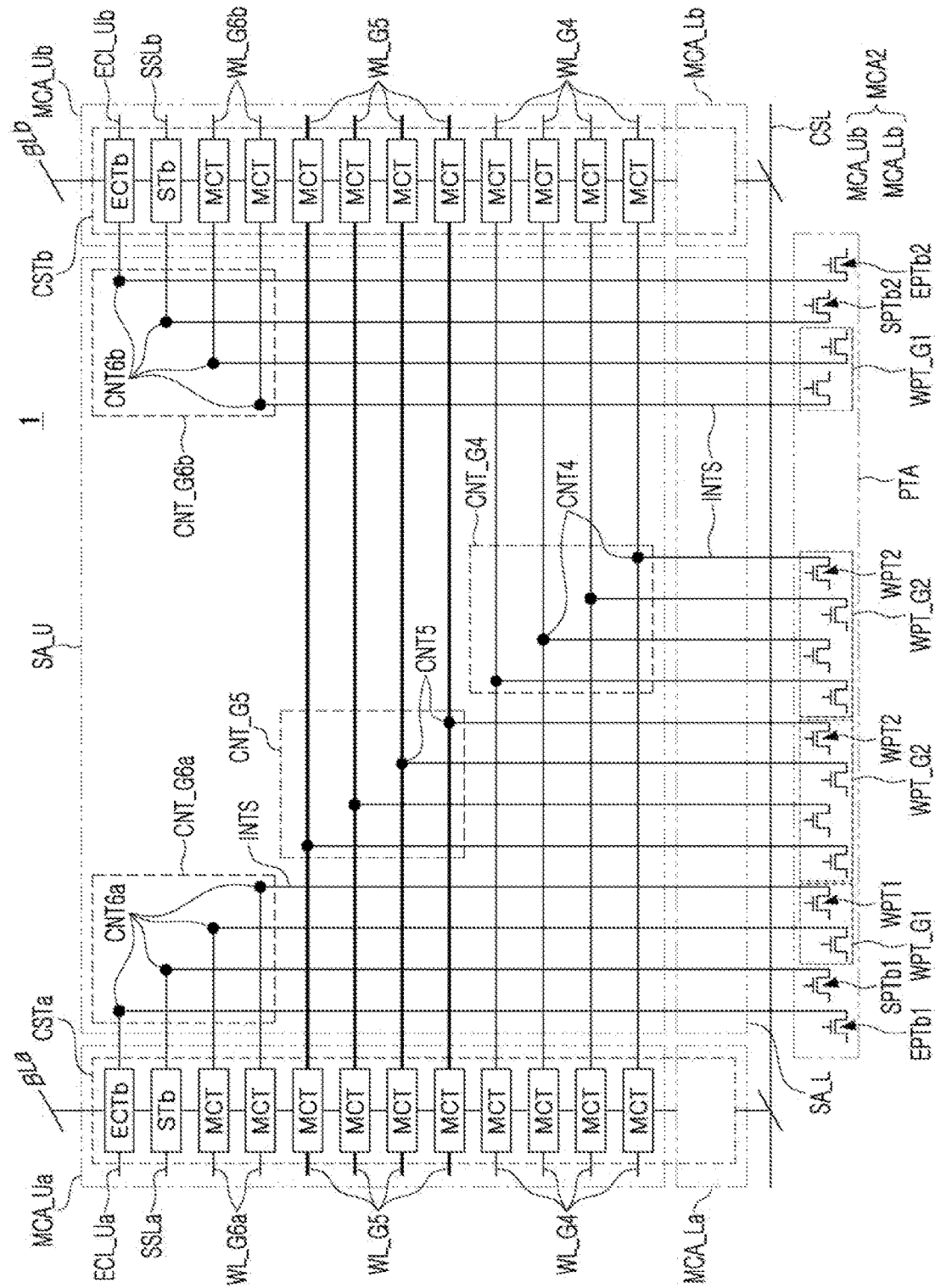
Figure 2B:
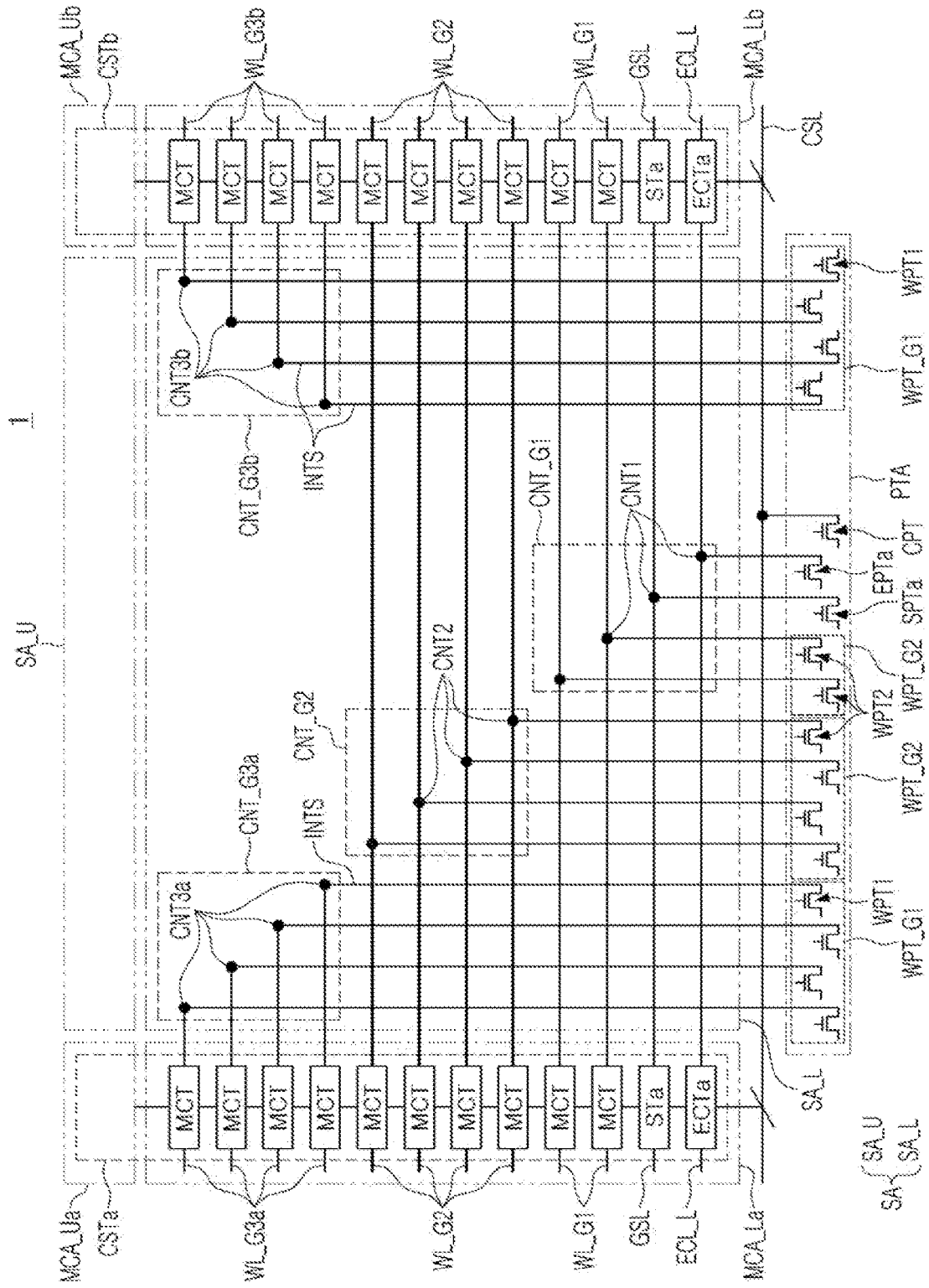

FIGS. 1, 2A, and 2B are views conceptually illustrating a semiconductor device according to an example embodiment. In FIGS. 1 to 2B, FIG. 1 is a conceptual perspective view illustrating positions in which regions in which respective components are located are arranged in a semiconductor device according to an example embodiment, FIGS. 2A and 2B are conceptual views illustrating components disposed in respective regions and an organic connection relationship between the components in a semiconductor device according to an example embodiment.

Figure 3:
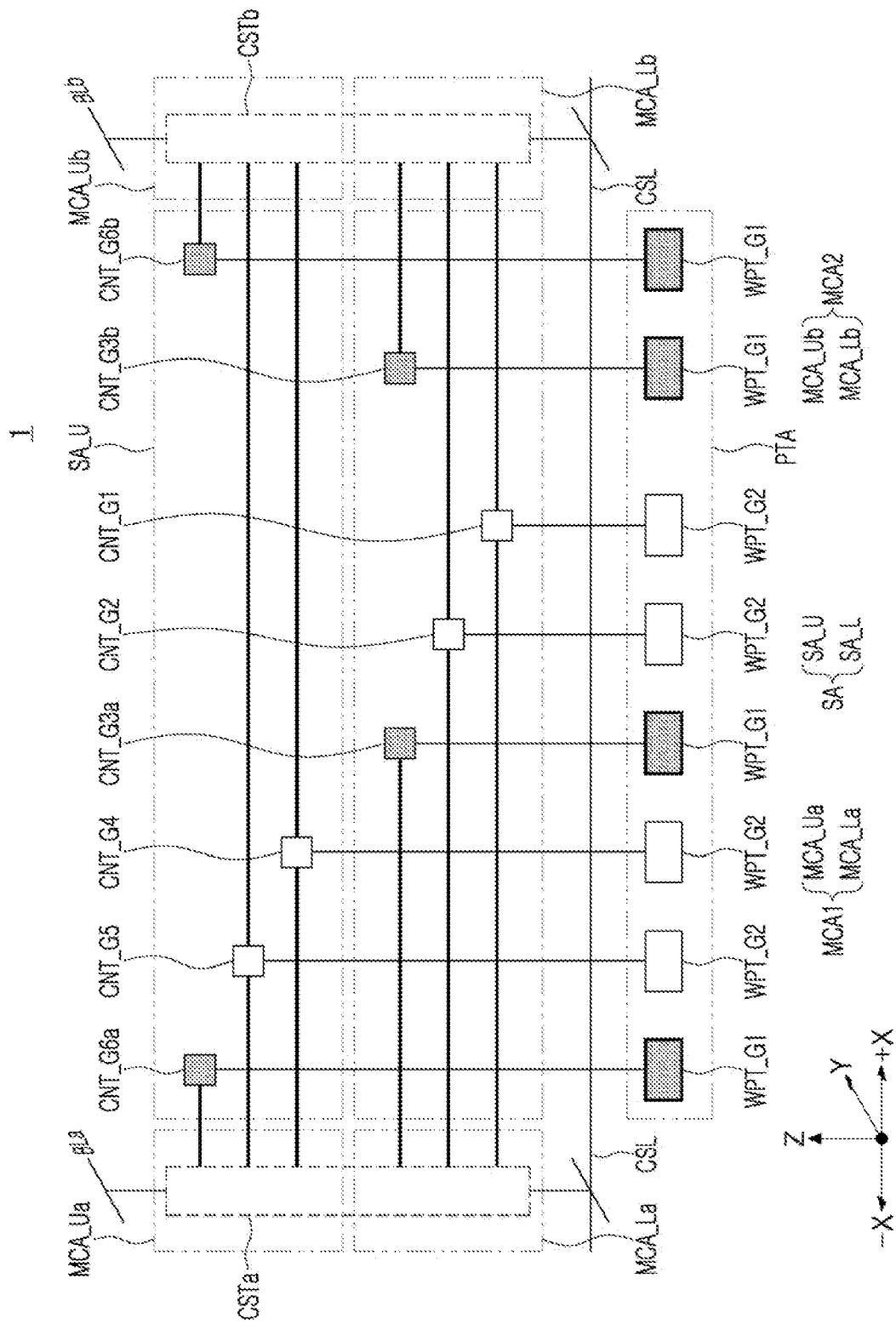
FIG. 3 is a view conceptually illustrating a semiconductor device according to an example embodiment.

FIG. 3 is a conceptual view illustrating positions in which the regions of FIGS. 2A and 2B are arranged, respectively.

First, referring to FIGS. 1, 2A, 2B, and 3, a semiconductor device 1 according to an embodiment may include a first structure 110 and a second structure 10, which overlap one another in a vertical direction Z. The first structure 110 may be disposed on the second structure 10.

The first structure 110 may include a common source region CSL, and memory blocks BLK on the common source region CSL.

Each of the memory blocks BLK may include a first memory region MCA1, a second memory region MCA2, and an extension region SA between the first memory region MCA1 and the second memory region MCA2. The extension region SA may be referred to as a step region.

The first memory region MCA1 may include a lower region MCA_La, and an upper region MCA_Ua on the lower region MCA_La. The second memory region MCA2 may include a lower region MCA_Lb, and an upper region MCA_Ub on the lower region MCA_Lb.

The extension region SA may include a lower region SA_L and an upper region SA_U on the lower region SA_L.

In the first and second memory regions MCA1 and MCA2 and the extension region SA, the lower regions MCA_La, MCA_Lb, and SA_L may be arranged on substantially the same height level, and the upper regions MCA_Ua, MCA_Ub, and SA_U may be arranged on substantially the same height level.

The second structure 10 may include a circuit region PTA overlapping the extension region SA in the vertical direction Z.

The first structure 110 may be referred to as a memory structure, and the second structure 10 may be referred to as a peripheral circuit structure.

Each of the first and second memory regions MCA1 and MCA2 may include a plurality of memory cell strings, and the semiconductor device 1 may further include bit lines BLa and BLb on the first memory region MCA1 and the second memory region MCA2.

Hereinafter, a first memory cell string CSTa among the plurality of memory cell strings in the first memory region MCA1 and a second memory cell string CSTb among the plurality of memory cell strings in the second memory region MCA2 will be mainly described.

Each of the first and second memory cell strings CSTa and CSTb may include transistors connected in series in the vertical direction Z. In each of the first and second memory cell strings CSTa and CSTb, the transistors may include a lower erase control transistor ECTa, a lower select transistor STa on the lower erase control transistor ECTa, memory cell transistors MCT on the lower select transistor STa, an upper select transistor STb on the memory cell transistors MCT, and an upper erase control transistor ECTb on the upper select transistor STb.

The bit lines BLa and BLb may include a first bit line BLa disposed on the first memory cell string CSTa and electrically connected to the first memory cell string CSTa, and a second bit line BLb disposed on the second memory cell string CSTb and electrically connected to the second memory cell string CSTb.

The first memory cell string CSTa may be disposed between the common source region CSL and the first bit line BLa. The second memory cell string CSTb may be disposed between the common source region CSL and the second bit line BLb.

The first structure 110 may include a plurality of gate electrodes spaced apart from each other in the vertical direction Z.

The plurality of gate electrodes may include a lower control gate electrode ECL_L, a lower select gate electrode GSL disposed on a higher level than the lower control gate electrode ECL_L, first lower common word lines WL_G1 disposed on a higher level than the lower select gate electrode GSL, second lower common word lines WL_G2 disposed on a higher level than the first lower common word lines WL_G1, first intermediate individual word lines WL_G3a and second intermediate individual word lines WL_G3b, arranged on a higher level than the second lower common word lines WL_G2, first upper common word lines WL_G4 arranged on a higher level than the first and second intermediate individual word lines WL_G3a and WL_G3b, second upper common word lines WL_G5 disposed on a higher level than the first upper common word lines WL_G4, first upper individual word lines WL_G6a and second upper individual word lines WL_G6b, arranged on a higher level than the second upper common word lines WL_G5, first upper select gate electrode SSLa and second upper select gate electrode SSLb, arranged on a higher level than the first and second upper individual word lines WL_G6a and WL_G6b, and a first upper erase control gate electrode ECL_Ua and a second upper erase control gate electrode ECL_Ub, arranged on a higher level than the first and second upper select gate electrodes SSLa and SSLb.

The lower control gate electrode ECL_L may be electrically connected to the lower erase control transistors ECTa of the first and second memory regions MCA1 and MCA2. The lower control gate electrode ECL_L may extend from the first memory region MCA1, may pass through the extension region SA, and may extend to the second memory region MCA2.

The lower select gate electrode GSL may be disposed on a higher level than the lower control gate electrode ECL_L. The lower select gate electrode GSL may be a gate electrode of the lower select transistors STa of the first and second memory regions MCA1 and MCA2. The lower select gate electrode GSL may extend from the first memory region MCA1, may pass through the extension region SA, and may extend to the second memory region MCA2.

The first and second lower common word lines WL_G1 and WL_G2 and the first and second upper common word lines WL_G4 and WL_G5 may be gate electrodes of the memory cell transistors MCT, located on the same height level as the first and second lower common word lines WL_G1 and WL_G2 and the first and second upper common word lines WL_G4 and WL_G5, among the memory cell transistors MCT. The first and second lower common word lines WL_G1 and WL_G2 and the first and second upper common word lines WL_G4 and WL_G5 may extend from the first memory region MCA1, may pass through the extension region SA, and may extend to the second memory region MCA2.

The first intermediate individual word lines WL_G3a and the first upper individual word lines WL_G6a may be gate electrodes of the memory cell transistors MCT, located on the same height level as the first intermediate individual word lines WL_G3a and the first upper individual word lines WL_G6a, among the memory cell transistors MCT of the first memory region MCA1. The first intermediate individual word lines WL_G3a and the first upper individual word lines WL_G6a may extend from the first memory region MCA1 to a partial region of the extension region SA, and may be spaced apart from the second memory region MCA2.

The second intermediate individual word lines WL_G3b and the second upper individual word lines WL_G6b may be gate electrodes of the memory cell transistors MCT, located on the same height level as the second intermediate individual word lines WL_G3b and the second upper individual word lines WL_G6b, among the memory cell transistors MCT of the second memory region MCA2. The second intermediate individual word lines WL_G3b and the second upper individual word lines WL_G6b may extend from the second memory region MCA2 to a partial region of the extension region SA, and may be spaced apart from the first memory region MCA1.

The first upper select gate electrode SSLa may be a gate electrode of the first upper select transistor STb in the first memory region MCA1. The second upper select gate electrode SSLb may be a gate electrode of the second upper select transistor STb in the memory region MCA2.

The first upper erase control gate electrode ECL_Ua may be a gate electrode of the upper erase control transistor ECTb in the first memory region MCA1. The second upper erase control gate electrode ECL_Ub may be a gate electrode of the upper erase control transistor ECTb in the second memory region MCA2.

In the plurality of gate electrodes, the lower control gate electrode ECL_L, the lower select gate electrode GSL, the first lower common word lines WL_G1, the second lower common word lines WL_G2, the first intermediate individual word lines WL_G3a, and the second intermediate individual word lines WL_G3b may be disposed in the lower regions MCA_La, MCA_Lb, and SA_L, and the first upper common word lines WL_G4, the second upper common word lines WL_G5, the first and second upper individual word lines WL_G6a and WL_G6b, the first and second upper select gate electrodes SSLa and SSLb, and the first and second upper erase control gate electrodes ECL_Ua and ECL_Ub may be disposed in the upper regions MCA_Ua, MCA_Ub, and SA_U.

The semiconductor device 1 may include contact plugs contacting the plurality of gate electrodes in the extension region SA.

The contact plugs may include first lower common contact plugs CNT1 contacting the lower control gate electrode ECL_L, the lower select gate electrode GSL, and the first lower common word lines WL_G1. The contact plugs may include second lower common contact plugs CNT2 contacting the second lower common word lines WL_G2. The contact plugs may include first intermediate individual contact plugs CNT3a contacting the first intermediate individual word lines WL_G3a. The contact plugs may include second intermediate individual contact plugs CNT3b contacting the second intermediate individual word lines WL_G3b. The contact plugs may include first upper common contact plugs CNT4 contacting the first upper common word lines WL_G4. The contact plugs may include second upper common contact plugs CNT5 contacting the second upper common word lines WL_G5. The contact plugs may include first upper individual contact plugs CNT6a contacting the first upper individual word lines WL_G6a, the first upper select gate electrode SSLa, and the first upper erase control the gate electrode ECL_Ua. The contact plugs may include second upper individual contact plugs CNT6b contacting the second upper individual word lines WL_G6b, the second upper select gate electrode SSLb, and the second upper erase control gate electrode ECL_Ub.

In the extension region SA, regions in which the plurality of gate electrodes and the contact plugs are in contact with each other may be defined as contact regions.

The contact regions may include a first lower common contact region CNT_G1 in which the first lower common contact plugs CNT1 are disposed, a second lower common contact region CNT_G2 in which the second lower common contact plugs CNT2 are disposed, a first intermediate individual contact region CNT_G3a in which the first intermediate individual contact plugs CNT3a are disposed, a second intermediate individual contact region CNT_G3b in which the second intermediate individual contact plugs CNT3b are disposed, a first upper common contact region CNT_G4 in which the first upper common contact plugs CNT4 are disposed, a second upper common contact region CNT_G5 in which the second upper common contact plugs CNT5 are disposed, a first upper individual contact region CNT_G6a in which the first upper individual contact plugs CNT6a are disposed, and a second upper individual contact region CNT_G6b in which the second upper individual contact plugs CNT6b are disposed.

In the second structure 10, the circuit region PTA may be a pass transistor circuit region in which pass transistors electrically connected to the transistors of the first and second memory cell strings CSTa and CSTb are disposed.

The semiconductor device 1 may include wiring connection structures INTS electrically connecting the pass transistors and the contact plugs in the circuit region PTA.

The transistors of the first and second memory cell strings CSTa and CSTb and the pass transistors may be electrically connected through the contact plugs and the wiring connection structures INTS.

The pass transistors of the circuit region PTA may include a pass transistor EPTa electrically connected to a gate electrode of the lower erase control transistor ECTa. The pass transistors of the circuit region PTA may include a pass transistor SPTa electrically connected to a gate electrode of the lower select transistor STa. The pass transistors of the circuit region PTA may include pass transistors EPTb1 and EPTb2 electrically connected to gate electrodes of the upper erase control transistors ECTb. The pass transistors of the circuit region PTA may include pass transistors SPTb1 and SPTb2 electrically connected to gate electrodes of the upper select transistors STb.

Additionally, the pass transistors of the circuit region PTA may include common pass transistors WPT2 electrically connected to the first and second lower common word lines WL_G1 and WL_G2 and the first and second upper common word lines WL_G4 and WL_G5 respectively. The pass transistors of the circuit region PTA may include individual pass transistors WPT1 electrically connected to the first and second intermediate individual word lines WL_G3a and WL_G3b and the first and second upper individual word lines WL_G6a and WL_G6b.

A region in which the individual pass transistors WPT1 are disposed may be defined as an individual pass transistor region WPT_G1.

A region in which the common pass transistors WPT2 are disposed may be defined as a common pass transistor region WPT_G2.

Because the common pass transistors WPT2 are provided, the total number of pass transistors may be reduced.

As described above, the semiconductor device 1 may include the common pass transistors WPT2 electrically connected to the first and second lower common word lines WL_G1 and WL_G2 and the first and second upper common word lines WL_G4 and WL_G5, respectively, entirely arranged in the first memory region MCA1 and the second memory region MCA2, to reduce an overall plan area of the semiconductor device 1. Therefore, a degree of integration of the semiconductor device 1 may be improved.

Hereinafter, an example region in which the contact regions are disposed will be described with reference to FIG. 3.

Referring to FIG. 3 together with FIGS. 2A and 2B, the contact regions (for example, the first lower common contact region CNT_G1, the second lower common contact region CNT_G2, the first intermediate individual contact region CNT_G3a, the second intermediate individual contact region CNT_G3b, the first upper common contact region CNT_G4, the second upper common contact region CNT_G5, the first upper individual contact region CNT_G6a, and the second upper individual contact region CNT_G6b) may be disposed in the extension region SA, as illustrated in FIG. 3.

The first lower common contact region CNT_G1 may be disposed on the lowest height level among the contact areas, and may be disposed closer to the second memory region MCA2, compared to the first memory region MCA1.

In a first positive direction (+X) from the first memory region MCA1 toward the second memory region MCA2, the first upper individual contact region CNT_G6a, the second upper common contact region CNT_G5, the first upper common contact region CNT_G4, the first intermediate individual contact region CNT_G3a, the second lower common contact region CNT_G2, and the first lower common contact region CNT_G1 may be arranged to sequentially have lower height levels.

In a first negative direction (−X) from the second memory region MCA2 toward the first memory region MCA1, the second upper individual contact region CNT_G6b and the second intermediate individual contact region CNT_G3b may be arranged to sequentially have lower height levels.

The contact regions may be varied from the arrangement illustrated in FIGS. 2A, 2B and 3, and may be arranged in a different shape, for example, the shape illustrated in FIG. 4, as will now be described.

Figure 4:
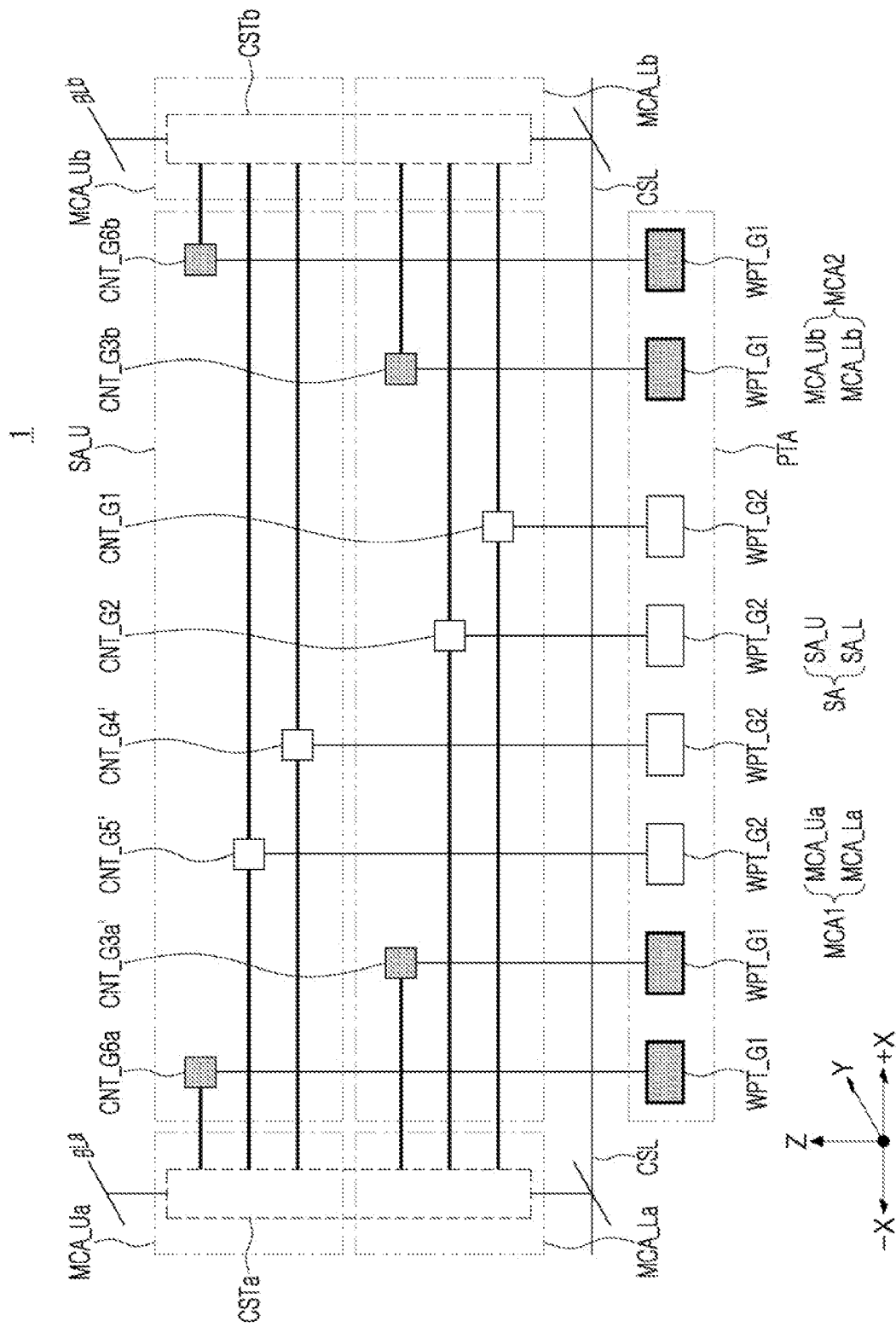
FIG. 4 is a view conceptually illustrating a modified example of a semiconductor device according to an example embodiment.

FIG. 4 is a view conceptually illustrating a modified example of a region in which the contact regions are disposed in FIGS. 2A, 2B, and 3.

In a modified example, referring to FIG. 4, in the first positive direction (+X) from the first memory region MCA1 to the second memory region MCA2, the first upper individual contact region CNT_G6a, a first intermediate individual contact region CNT_G3a', a second upper common contact region CNT_G5', a first upper common contact region CNT_G4', the second lower common contact region CNT_G2, and the first lower common contact region CNT_G1 may be sequentially disposed.

In this case, the first intermediate individual contact region CNT_G3a', the second upper common contact region CNT_G5', and the first upper common contact region CNT_G4' may correspond to the first intermediate individual contact region (CNT_G3a of FIG. 2B), the second upper common contact region (CNT_G5 of FIG. 2A), and the first upper common contact region (CNT_G4 of FIG. 2A), respectively, described with reference to FIGS. 2A and 2B.

Next, examples of the first memory region MCA1, the extension region SA, and the second memory region MCA2, described above conceptually, will be described with reference to FIGS. 5, 6A, 6B, 6C, 7, 8A, and 8B.

Hereinafter, in the description with reference to FIGS. 5 to 8B, descriptions of contents substantially the same as those described with reference to FIGS. 1 to 3 will be omitted.

Figure 5:
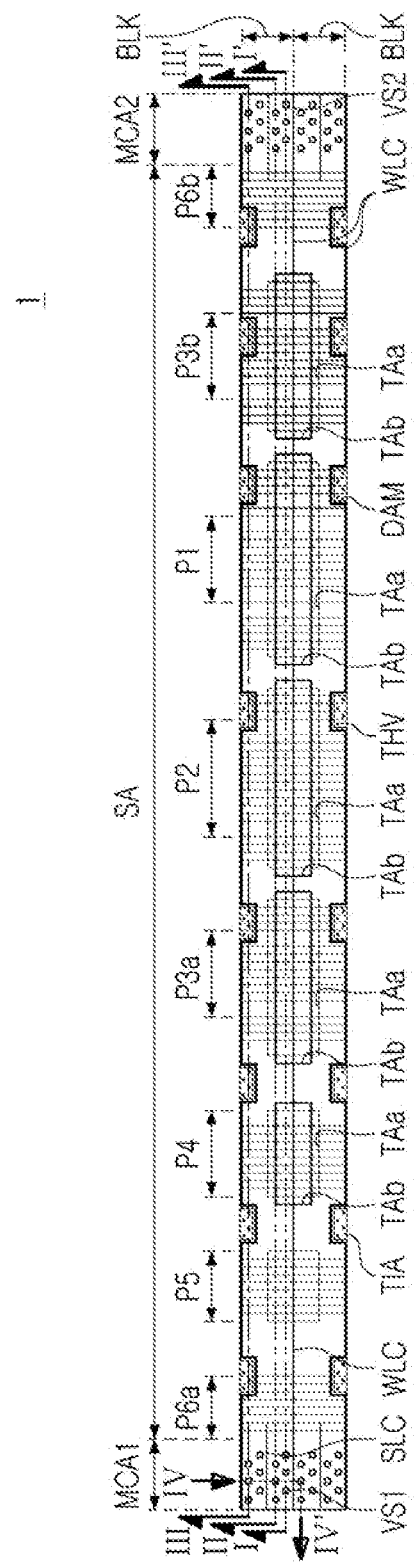
FIGS. 5, 6A to 6C, 7, 8A, 8B, and 9A to 9E are views conceptually illustrating an example of a semiconductor device according to an example embodiment.
Figure 6A:
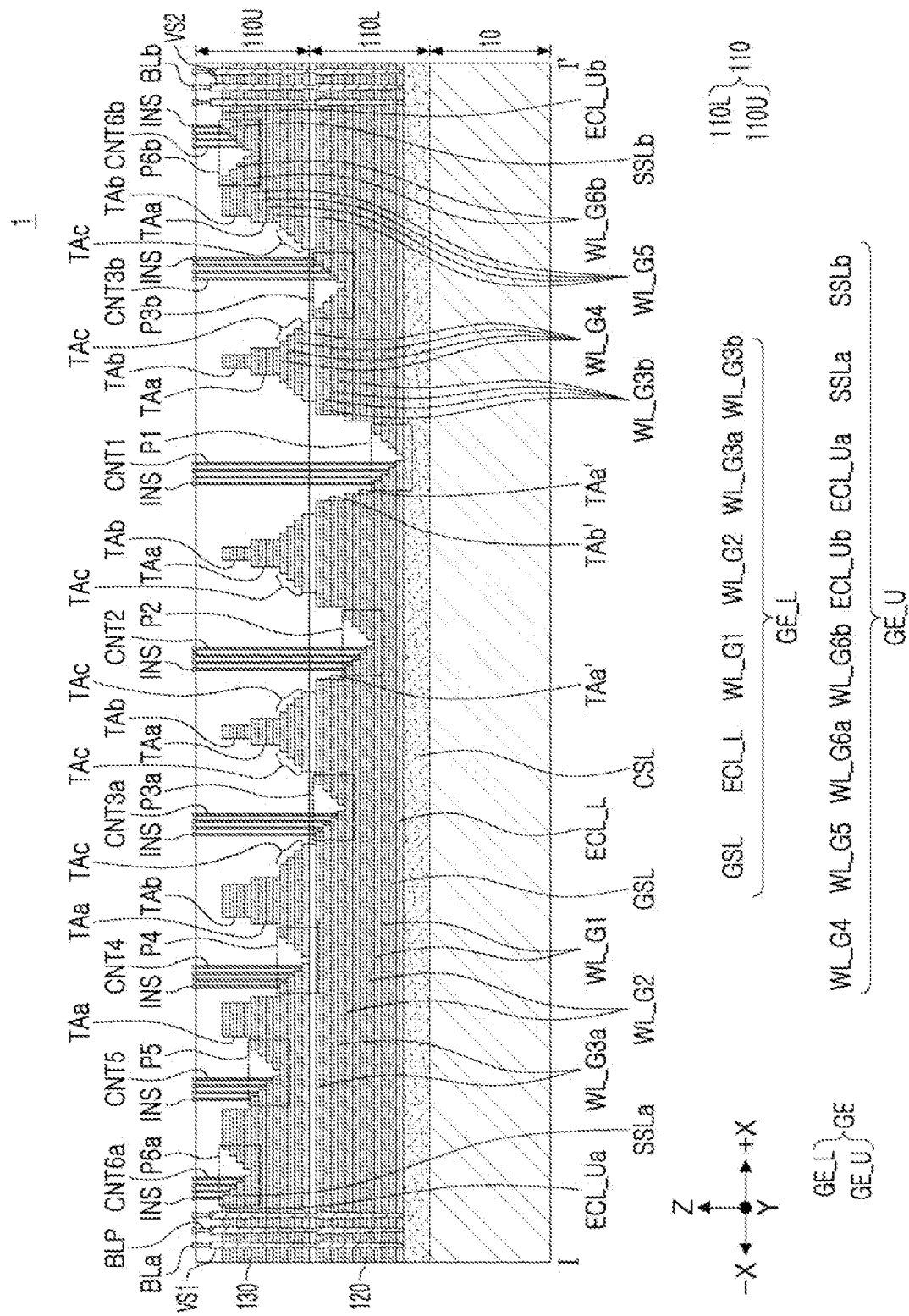
Figure 6B:
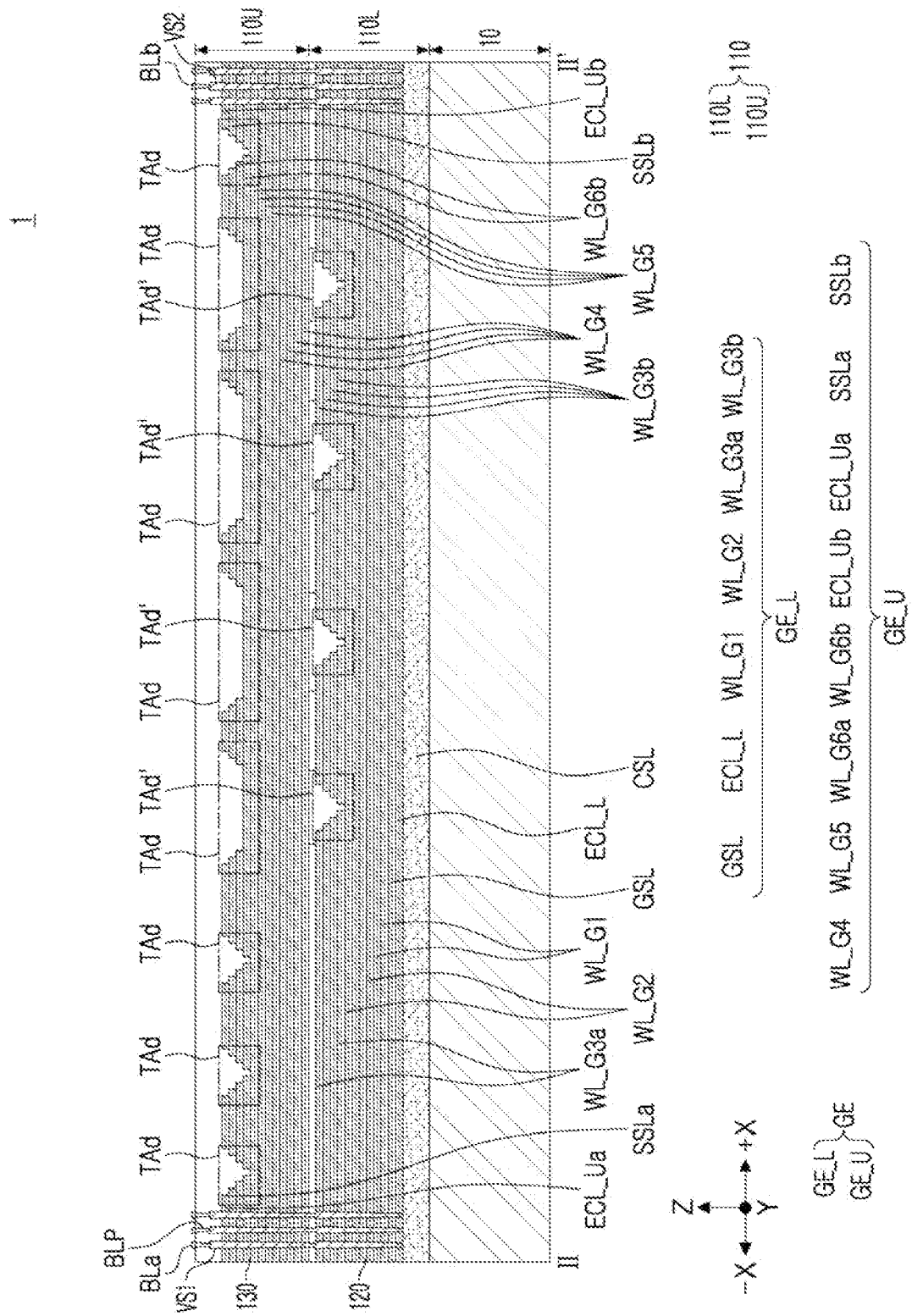
Figure 6C:
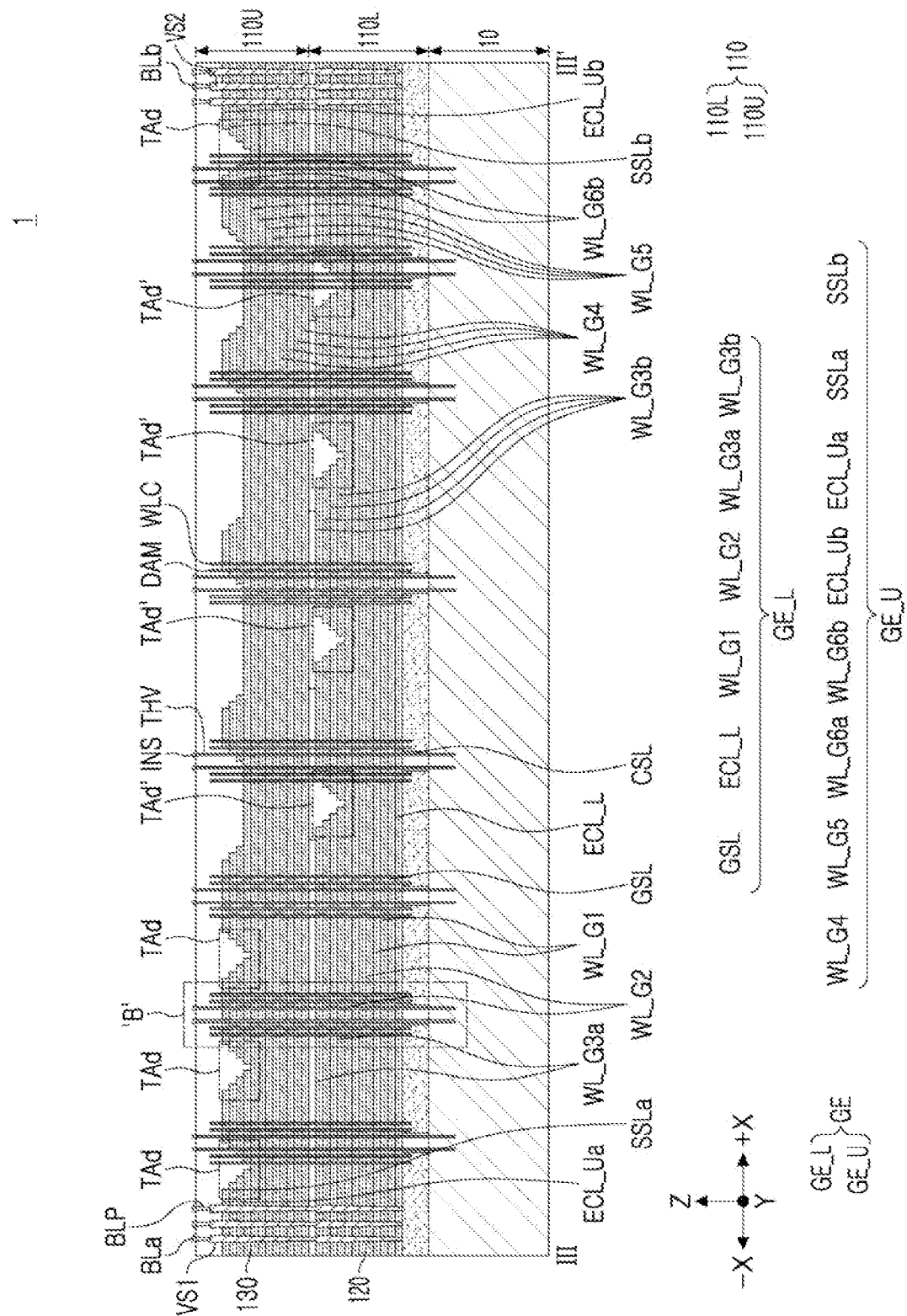
Figure 7:
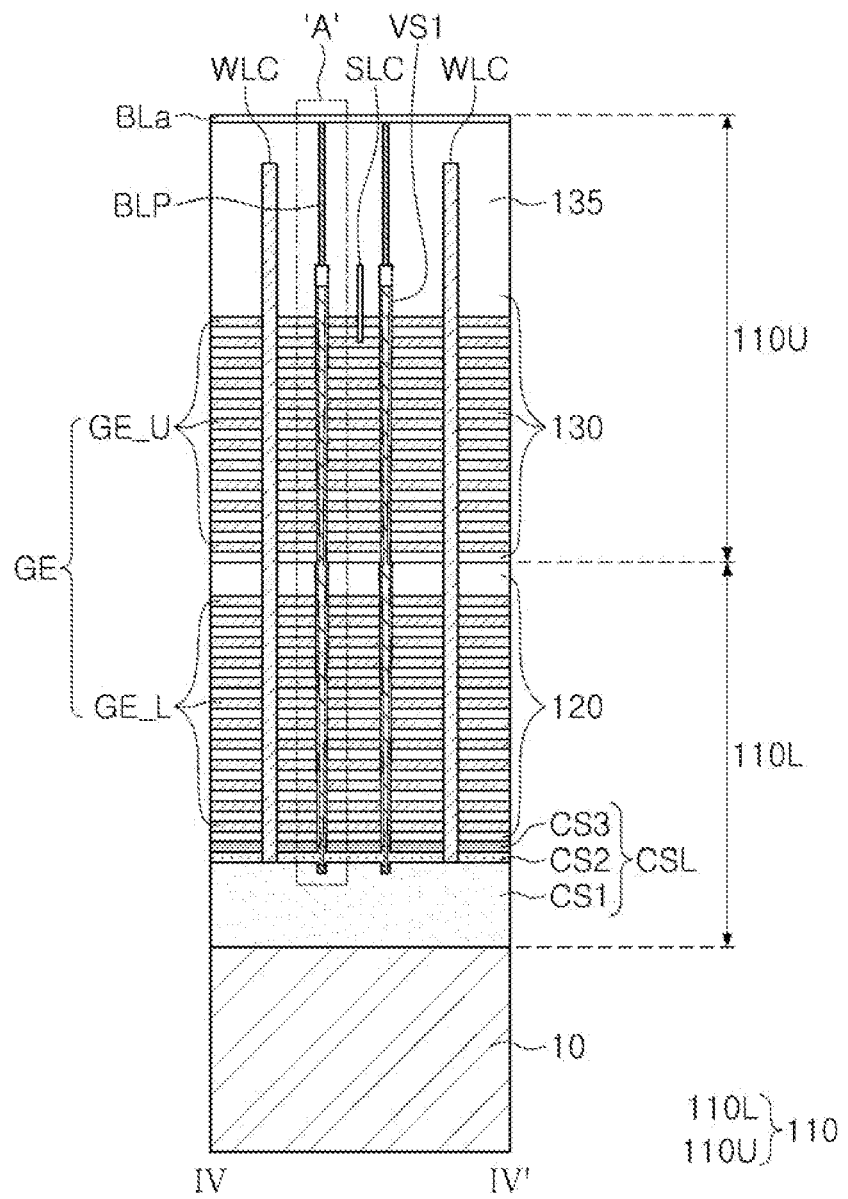
Figure 8A:
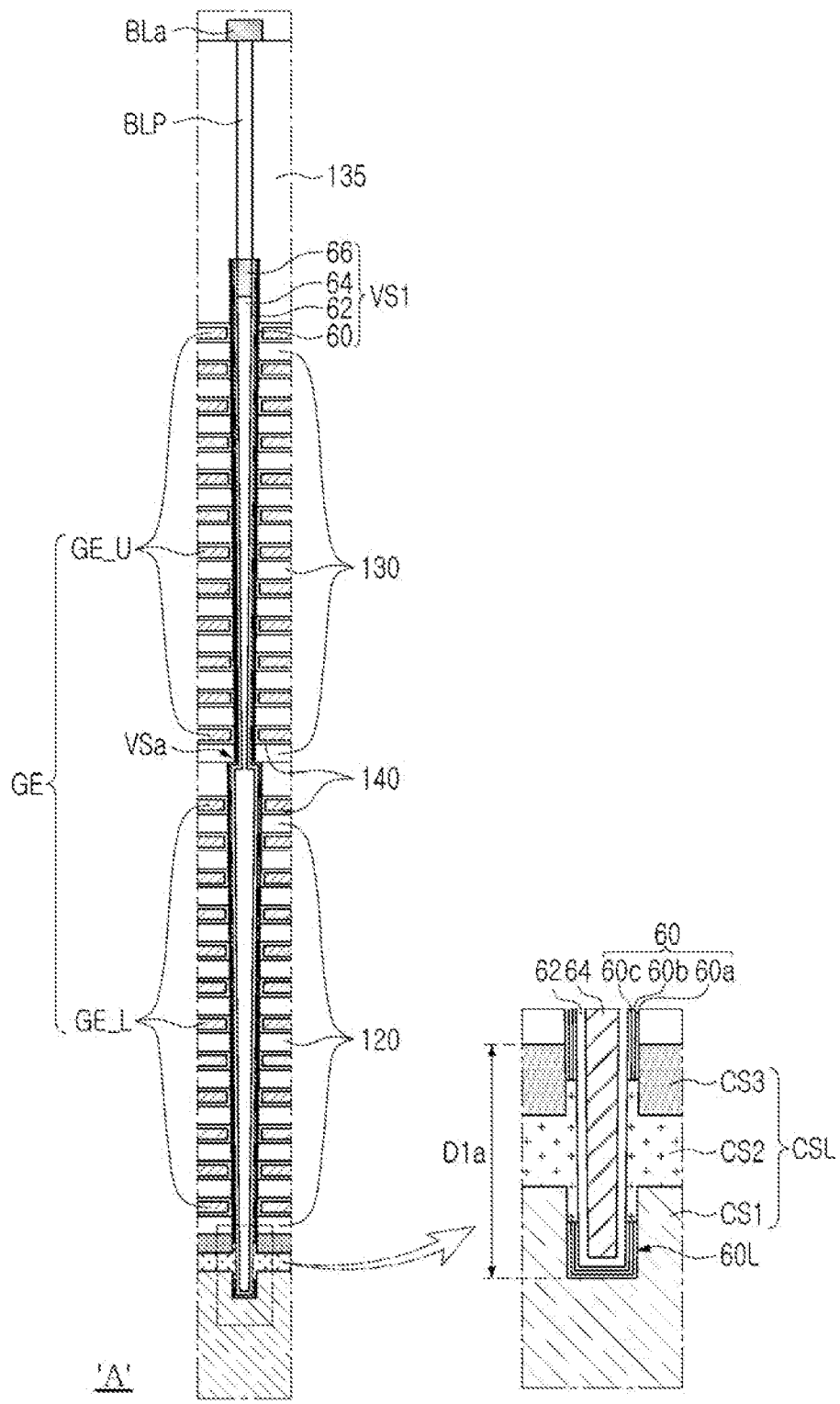
Figure 8B:
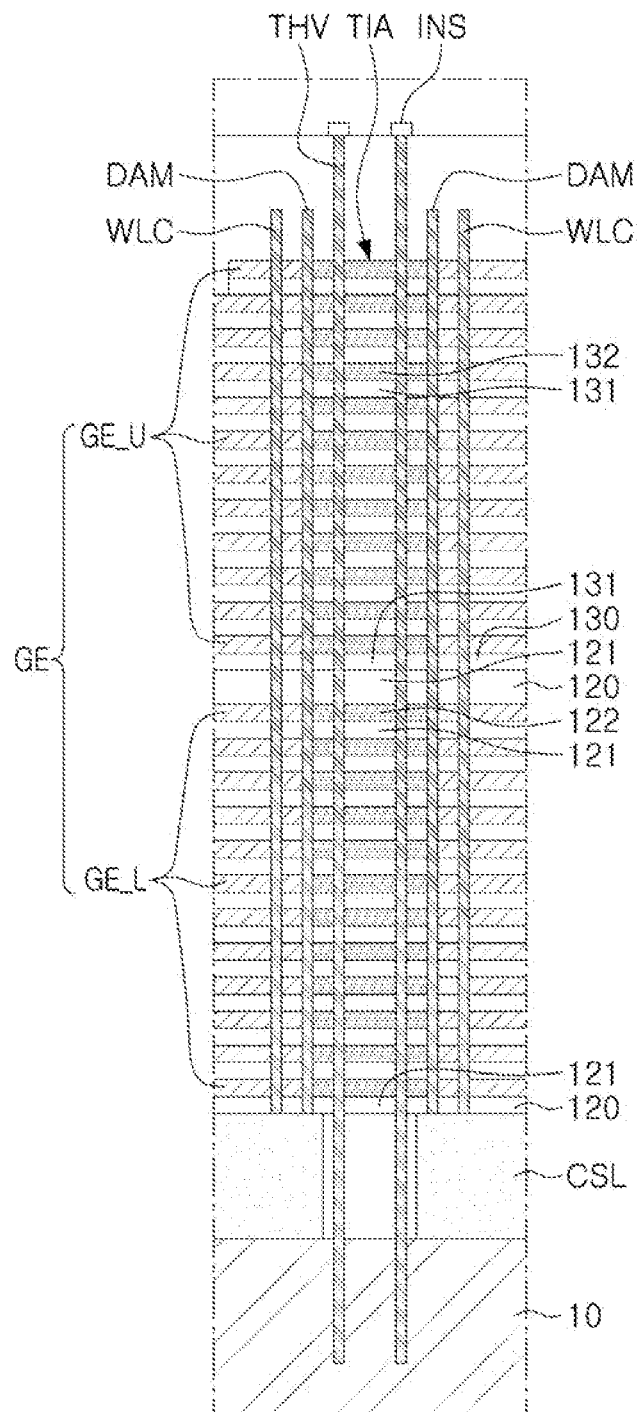

In FIGS. 5 to 8B, FIG. 5 is a plan view illustrating an example of a semiconductor device 1 according to an example embodiment, FIG. 6A is a cross-sectional view conceptually illustrating a region taken along line I-I' of FIG. 5, FIG. 6B is a cross-sectional view conceptually illustrating a region taken along line II-IF of FIG. 5, FIG. 6C is a cross-sectional view conceptually illustrating a region taken along line of FIG. 5, and FIG. 7 is a cross-sectional view conceptually illustrating a region taken along line IV-IV' of FIG. 5. FIG. 8A is a partially enlarged view of portion 'A' of FIG. 7, and FIG. 8B is a partially enlarged view of portion 'B' of FIG. 6C.

Referring to FIGS. 5 to 8B, in the semiconductor device 1 including the first structure 110 and the second structure 10, described with reference to FIGS. 1 to 3, the first structure 110 may include a lower structure 110L and an upper structure 110U on the lower structure 110L.

The first structure 110 may include a common source region CSL and memory blocks (BLK of FIG. 1) on the common source region CSL, as described with reference to FIGS. 1 to 3.

In the first structure 110, each of the memory blocks (BLK in FIG. 1) may include the first memory region MCA1 including the lower region MCA_La and the upper region MCA_Ua, the second memory region MCA2 including the lower region MCA_Lb and the upper region MCA_Ub, and the extension region SA including the lower region SA_L and the upper region SA_U, described with reference to FIGS. 1 to 3.

In the first structure 110, the lower structure 110L may be disposed in the lower regions MCA_La, MCA_Lb, and SA_L, and the upper structure 110U may be disposed in the upper regions MCA_Ua, MCA_Ub, and SA_U.

The first structure 110 may include gate electrodes GE disposed in each of the memory blocks (BLK of FIG. 1) and spaced apart from each other.

The gate electrodes GE may include lower gate electrodes GE_L disposed in the lower structure 110L and spaced apart from each other in a vertical direction Z, and upper gate electrodes GE_U disposed in the upper structure 110U and spaced apart from each other in the vertical direction Z.

A portion of the lower gate electrodes GE_L may extend from the first memory region MCA1, may pass through the extension region SA, and may extend to the second memory region MCA2, another portion thereof may extend from the first memory region MCA1 to a partial region of the extension region SA and may be spaced apart from the second memory region MCA2, and the remainder thereof may extend from the second memory region MCA2 to a partial region of the extension region SA and may be spaced apart from the first memory region MCA1.

The lower gate electrodes GE_L may include the lower control gate electrode ECL_L, the lower select gate electrode GSL, the first lower common word lines WL_G1, the second lower common word lines WL_G2, the first intermediate individual word lines WL_G3a, and the second intermediate individual word lines WL_G3b, described with reference to FIGS. 1 to 2B.

A portion of the upper gate electrodes GE_U may extend from the first memory region MCA1, may pass through the extension region SA, and may extend to the second memory region MCA2, another portion thereof may extend from the first memory region MCA1 to a partial region of the extension region SA and may be spaced apart from the second memory region MCA2, and the remainder thereof may extend from the second memory region MCA2 to a partial region of the extension region SA and may be spaced apart from the first memory region MCA1.

The upper gate electrodes GE_L may include the first upper common word lines WL_G4, the second upper common word lines WL_G5, the first and second upper individual word lines WL_G6a and WL_G6b, the first and second upper select gate electrodes SSLa and SSLb, and the first and second upper erase control gate electrodes ECL_Ua and ECL_Ub, described with reference to FIGS. 1 to 2B.

The first structure 110 may include the first lower common contact plugs CNT1, the second lower common contact plugs CNT2, the first intermediate individual contact plugs CNT3a, the second intermediate individual contact plugs CNT3b, the first upper common contact plugs CNT4, the second upper common contact plugs CNT5, the first upper individual word lines WL_G6a, the first upper individual contact plugs CNT6a, and the second upper individual contact plugs CNT6b, described above.

The contact plugs CNT1, CNT2, CNT3a, CNT3b, CNT4, CNT5, CNT6a, and CNT6b may be in contact with pads of the gate electrodes GE, and may extend in the vertical direction Z.

The first structure 110 may include a plurality of pad regions P1, P2, P3a, P3b, P4, P5, P6a, and P6b. Each of the plurality of pad regions P1, P2, P3a, P3b, P4, P5, P6a, and P6b may have a step shape that gradually decreases and then increases gradually in the first positive direction (+X).

The plurality of pad regions P1, P2, P3a, P3b, P4, P5, P6a, and P6b may include pads of the gate electrodes GE contacting the contact plugs CNT1, CNT2, CNT3a, CNT3b, CNT4, CNT5, CNT6a, and CNT6b.

For example, in a region in which the lower gate electrodes GE_L are located, the plurality of pad regions P1, P2, P3a, and P3b may include a first lower common pad region P1, a second lower common pad region P2 having a higher level than the first lower common pad region P1, and a first lower individual pad region P3a and a second lower individual pad region P3b, disposed on a higher level than the second lower common pad region P2, disposed on the same height level, and spaced apart from each other. Also, in a region in which the upper gate electrodes GE_U are located, the plurality of pad regions P4, P5, P6a, and P6b may include a first upper common pad region P4, a second upper common pad region P5 having a higher level than the first upper common pad region P4, and a first upper individual pad region P6a and a second upper individual pad region P6b, disposed on a level higher than the second upper common pad region P5, disposed on the same height level, and spaced apart from each other.

Each of the plurality of pad regions P1, P2, P3a, P3b, P4, P5, P6a, and P6b may have a 'V' shape or a 'V-like' shape. For example, each of the plurality of pad regions P1, P2, P3a, P3b, P4, P5, P6a, and P6b may have a step shape that gradually decreases from a region close to the first memory region MCA1 in the first positive direction (+X), and then gradually increases again.

The first lower common pad region P1 may include the first lower common contact region CNT_G1. The second lower common pad region P2 may include the second lower common contact region CNT_G2. The first lower individual pad region P3a may include the first intermediate individual contact region CNT_G3a. The second lower individual pad region P3b may include the second intermediate individual contact region CNT_G3b.

The first upper common pad region P4 may include the first upper common contact region CNT_G4. The second upper common pad region P5 may include the second upper common contact region CNT_G5. The first upper individual pad region P6a may include the first upper individual contact region CNT_G6a. The second upper individual pad region P6b may include the second upper individual contact region CNT_G6b.

In the first structure 110, the lower structure 110L may further include lower interlayer insulating layers 120 alternately and repeatedly stacked with the lower gate electrodes GE_L. Among the lower gate electrodes GE_L and the lower interlayer insulating layers 120, a lowermost layer and an uppermost layer may be a lower interlayer insulating layer. Among the lower interlayer insulating layers 120, an uppermost layer may have a greater thickness than the remaining layers.

The lower structure 110L may include a first lower through-region TAa' and second lower through-regions TAb'. The first lower through-region TAa' and the second lower through-regions TAb' may be sequentially disposed on the first lower common pad region P1. The first lower through-region TAa' may be disposed on the second lower common pad region P2.

In the first structure 110, the upper structure 110U may further include upper interlayer insulating layers 130 alternately and repeatedly stacked with the upper gate electrodes GE_U. The upper structure 110U may further include stepped through-regions TAc, first upper through-regions TAa, and second upper through-regions TAb.

A first upper through-region TAa may be disposed on the second upper common pad region P5. A first upper through-region TAa and a second upper common pad region Tab may be sequentially disposed on the first upper common pad region P4.

A stepped through-region TAc, a first upper through-region TAa, and a second upper through-region TAb may be sequentially disposed on the first and second lower individual pad regions P3a and P3b and the first and second lower common pad regions P1 and P2, respectively.

In an embodiment, in the "stepped through-region TAc", the term 'stepped' may be used in the sense that a side of the stepped through-region TAc has a stepped shape, as in FIG. 6A. However, this is not intended to be limited by the term 'stepped.' For example, the term "stepped through-region TAc" may be replaced with the term "through-region TAc" or other terms.

The first and second lower through-regions TAa' and TAb' and the first and second upper through-regions TAa and TAb may have a rectangular shape or a shape similar to that of a rectangle, respectively, as illustrated in FIG. 5.

In plan view, the stepped through-regions TAc may be disposed in each of the first and second upper through-regions TAa and TAb.

In the cross-sectional structure as illustrated in FIG. 6B, the lower structure 110L may include lower separation through-regions TAd', and the upper structure 110U may include upper separation through-regions TAd.

Sides of the lower separation through-regions TAd' and sides of the upper separation through-regions TAd may have a stepped shape, respectively.

The lower separation through-regions TAd' may be disposed between the first and second intermediate individual word lines WL_G3a and WL_G3b.

The upper separation through-regions TAd may be disposed between the first and second upper individual word lines WL_G6a and WL_G6b, between the first and second upper select gate electrodes SSLa and SSLb, and between the first and second upper erase control gate electrodes ECL_Ua and ECL_Ub.

Therefore, among the lower gate electrodes GE_L, gate electrodes disposed on a level lower than the lower separation through-regions TAd' may extend from the first memory region MCA1 to the second memory region MCA2, and, among the upper gate electrodes GE_U, gate electrodes disposed on a level lower than the upper separation through-regions TAd may extend from the first memory region MCA1 to the second memory region MCA2.

The semiconductor device 1 may further include separation structures WLC separating the memory blocks BLK from each other. For example, one memory block BLK may be disposed between a pair of adjacent separation structures among the separation structures WLC. The separation structures WLC may at least pass through the gate electrodes GE.

The semiconductor device 1 may further include through-wiring regions TIA, and a dam structure DAM defining the through-wiring regions TIA. The through-wiring region TIA may be disposed in the extension region SA, and may be spaced apart from the gate electrodes GE by the dam structure DAM.

Each of the through-wiring regions TIA may include interlayer insulating layers and mold insulating layers, alternately and repeatedly stacked. In the through-wiring regions TIA, the mold insulating layers may be disposed on substantially the same level as gate electrodes GE adjacent to the through-wiring regions TIA.

The semiconductor device 1 may further include through-electrodes THV passing through the through-wiring regions TIA and extending into the second structure 10.

The semiconductor device 1 may further include first vertical memory structures VS1 passing through the gate electrodes GE in the first memory region MCA1, and second vertical memory structures VS2 passing through the gate electrodes GE in the second memory region MCA2.

The semiconductor device 1 may further include first bit lines BLa electrically connected to the first vertical memory structures VS1 on the first vertical memory structures VS1, and second bit lines BLb electrically connected to the second vertical memory structures VS2 on the second vertical memory structures VS2.

The semiconductor device 1 may further include bit line plugs BLP for electrically connecting the first vertical memory structures VS1 and the first bit lines BLa between the first vertical memory structures VS1 and the first bit lines BLa, and bit line plugs BLP for electrically connecting the second vertical memory structures VS2 and the second bit lines BLb between the second vertical memory structures VS2 and the second bit lines BLb.

The semiconductor device 1 may further include connection wirings INS electrically connecting the contact plugs CNT1, CNT2, CNT3a, CNT3b, CNT4, CNT5, CNT6a, and CNT6b and the through-electrodes THV on the contact plugs CNT1, CNT2, CNT3a, CNT3b, CNT4, CNT5, CNT6a, and CNT6b and the through-electrodes THV.

The through-electrodes THV and the connection wirings INS may form at least a portion of wiring connection structures (e.g., INTS of FIGS. 2A and 2B).

Next, referring mainly to FIG. 8A, example cross-sectional structures of the first and second vertical memory structures VS1 and VS2 and the common source region CSL will be described.

Hereinafter, a cross-sectional structure of one of the first vertical memory structures VS1 will be mainly described, and it can be understood that a cross-sectional structure of the second vertical memory structure VS2 is identical to that of the first vertical memory structure VS1.

Referring to FIG. 8A, a first vertical memory structure VS1 may include an insulating core pattern 64, a channel layer 62 covering side surfaces and a bottom surface of the insulating core pattern 64, an information storage structure 60 disposed on outer side surfaces and a bottom surface of the channel layer 62, and a pad pattern 66 contacting the channel layer 62 on the insulating core pattern 64.

The insulating core pattern 64 may include silicon oxide. The channel layer 62 may include polysilicon. The pad pattern 66 may include at least one of doped polysilicon, metal nitride (e.g., TiN and the like), metal (e.g., W and the like), and a metal-semiconductor compound (e.g., TiSi and the like).

The information storage structure 60 may include a first dielectric layer 60a, a second dielectric layer 60c, and an information storage layer 60b between the first dielectric layer 60a and the second dielectric layer 60c.

The second dielectric layer 60c may be in contact with the channel layer 62, and the information storage layer 60b may be spaced apart from the channel layer 62.

The second dielectric layer 60c may include silicon oxide or silicon oxide doped with impurities.

The first dielectric layer 60a may include at least one of silicon oxide or a high-k dielectric.

The information storage layer 60b may include regions capable of storing information in a semiconductor device such as a flash memory device. For example, the information storage layer 60b may include a material capable of trapping a charge, for example, silicon nitride.

The common source region CSL may include a plate layer CS1, a first pattern layer CS2 on the plate layer CS1, and a second pattern layer CS3 on the first pattern layer CS2. Each of the first and second vertical memory structures VS1 and VS2 may pass through the first and second pattern layers CS2 and CS3, and may extend into the plate layer CS1.

The first pattern layer CS2 may pass through the information storage structure 60, and may be in contact with the channel layer 62. The information storage structure 60 may be separated in a vertical direction by the first pattern layer CS2.

The first pattern layer CS2 contacting the channel layer 62 may be formed as a silicon layer having N-type conductivity.

The gate electrodes GE may include at least one of doped polysilicon, a metal-semiconductor compound (e.g., TiSi, TaSi, CoSi, NiSi, or WSi), a metal nitride (e.g., TiN, TaN, or WN), or a metal (e.g., Ti or W).

The first structure 110 may further include a dielectric layer 140 covering an upper surface and a lower surface of each of the gate electrodes GE, and extending between each of the gate electrodes GE and the first vertical memory structure VS1.

The dielectric layer 140 may include a high-k dielectric such as AlO.

Next, a planar shape of a portion of the gate electrodes GE in a memory block BLK will be described with reference to FIGS. 9A to 9E.

Figure 9A:
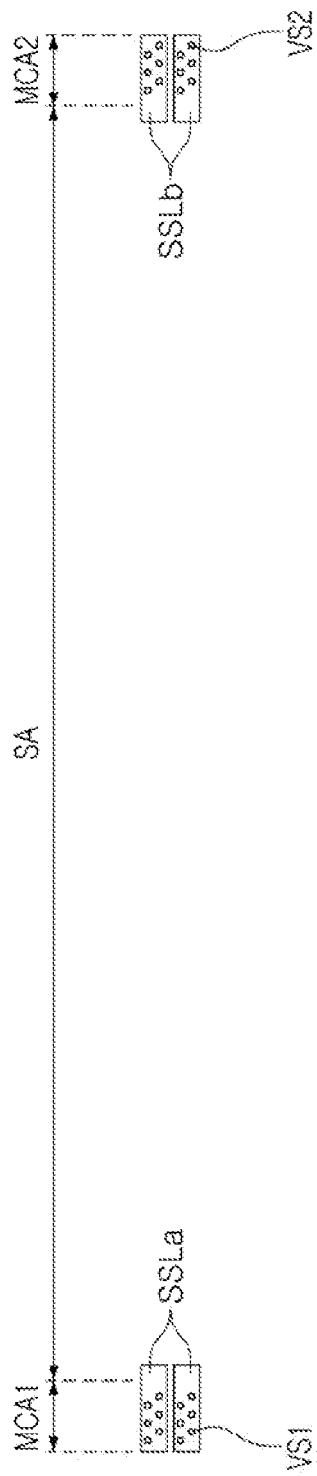

Referring to FIG. 9A, on any one height level in a memory block BLK, a first upper select gate electrode SSLa may be disposed as a plurality thereof, and a second upper select gate electrodes SSLb may be disposed as a plurality thereof. Similarly, a first upper erase control gate electrode ECL_Ua may be disposed as a plurality thereof, and a second upper erase control gate electrode ECL_Ub may be disposed as a plurality thereof.

Figure 9B:
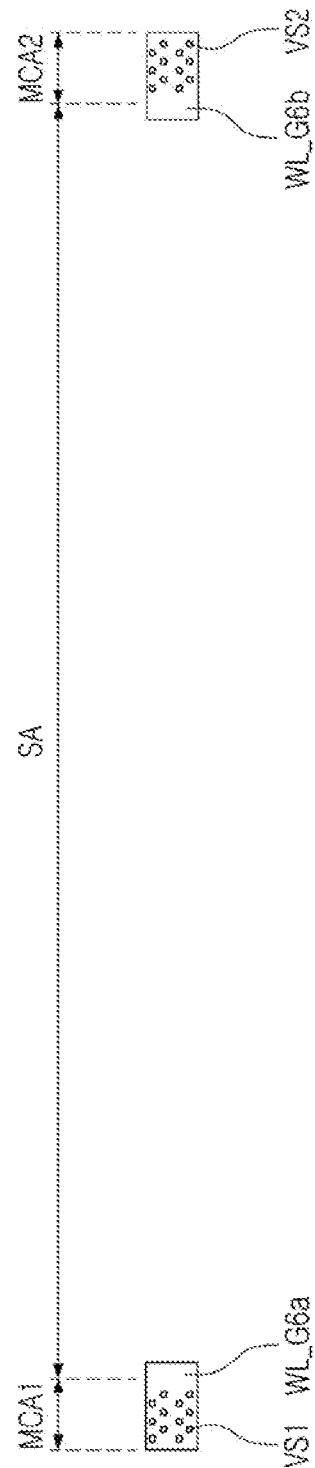

Referring to FIG. 9B, on any one height level in a memory block BLK, a first upper individual word line WL_G6a may be disposed as a plurality thereof, and a second upper individual word line WL_G6b may be disposed as a plurality thereof. Also, the first and second upper individual word lines WL_G6a and WL_G6b may be spaced apart from each other.

Figure 9C:
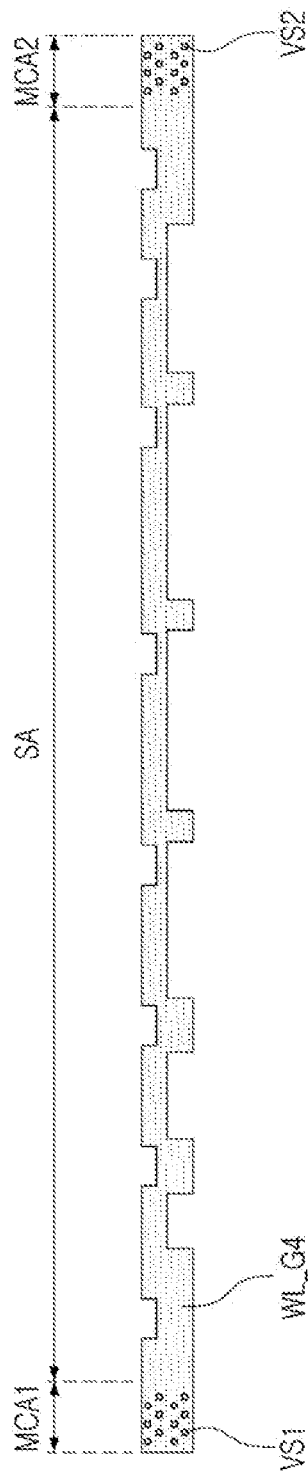

Referring to FIG. 9C, on any one height level in a memory block BLK, a first upper common word line WL_G4 may be disposed, and may extend from a first memory region MCA1 to a second memory region MCA2.

Figure 9D:
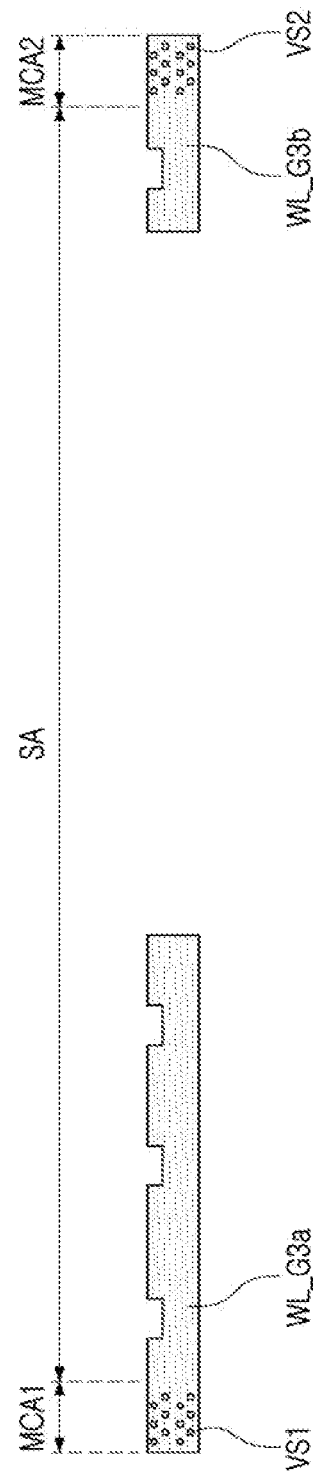

Referring to FIG. 9D, on any one height level in a memory block BLK, a first intermediate individual word line WL_G3a may be disposed, and a second intermediate individual word line WL_G3b may be disposed. Also, the first and second intermediate individual word lines WL_G3a and WL_G3b may be spaced apart from each other.

Figure 9E:
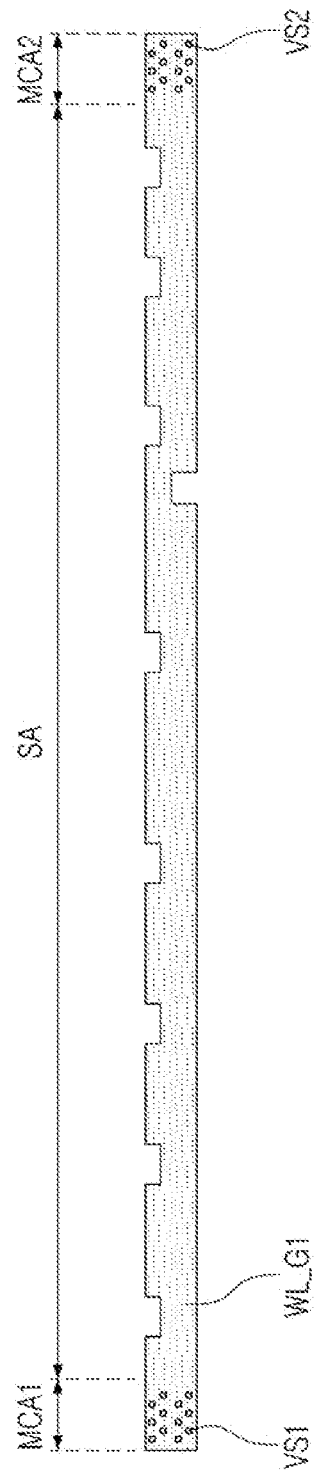

Referring to FIG. 9E, on any one height level in a memory block BLK, a first lower common word line WL_G1 may be disposed, and may extend from a first memory region MCA1 to a second memory region MCA2.

Next, examples of the common pass transistors WPT2 and the individual pass transistors WPT1, described with reference to FIGS. 1, 2A, and 2B, will be described with reference to FIGS. 10A to 10C.

Figure 10A:
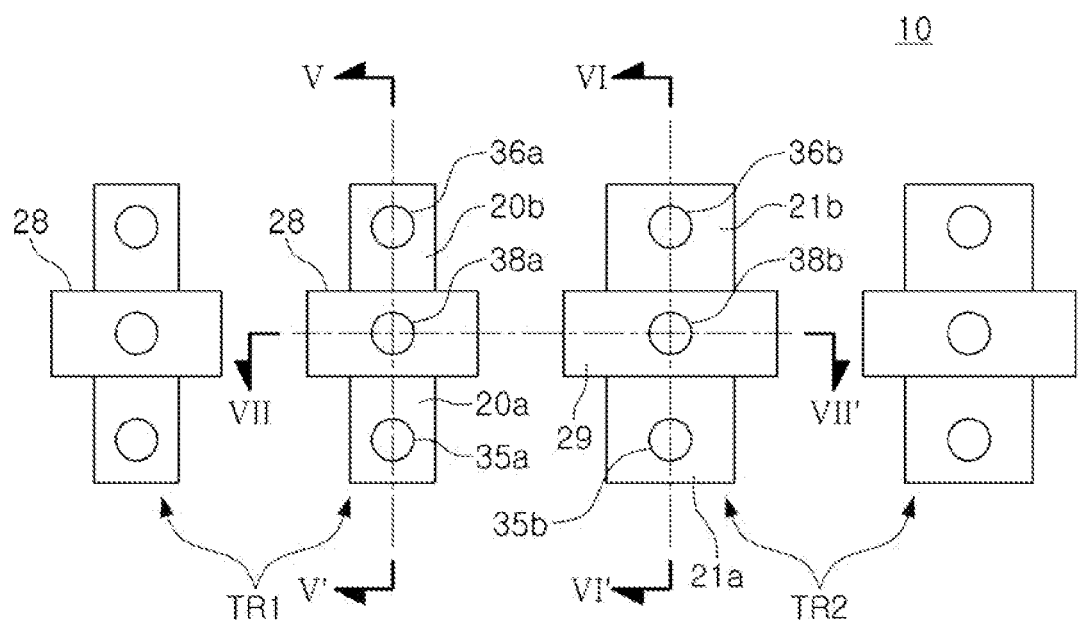
FIGS. 10A to 10C are views conceptually illustrating an example of a semiconductor device according to an example embodiment.
Figure 10B:
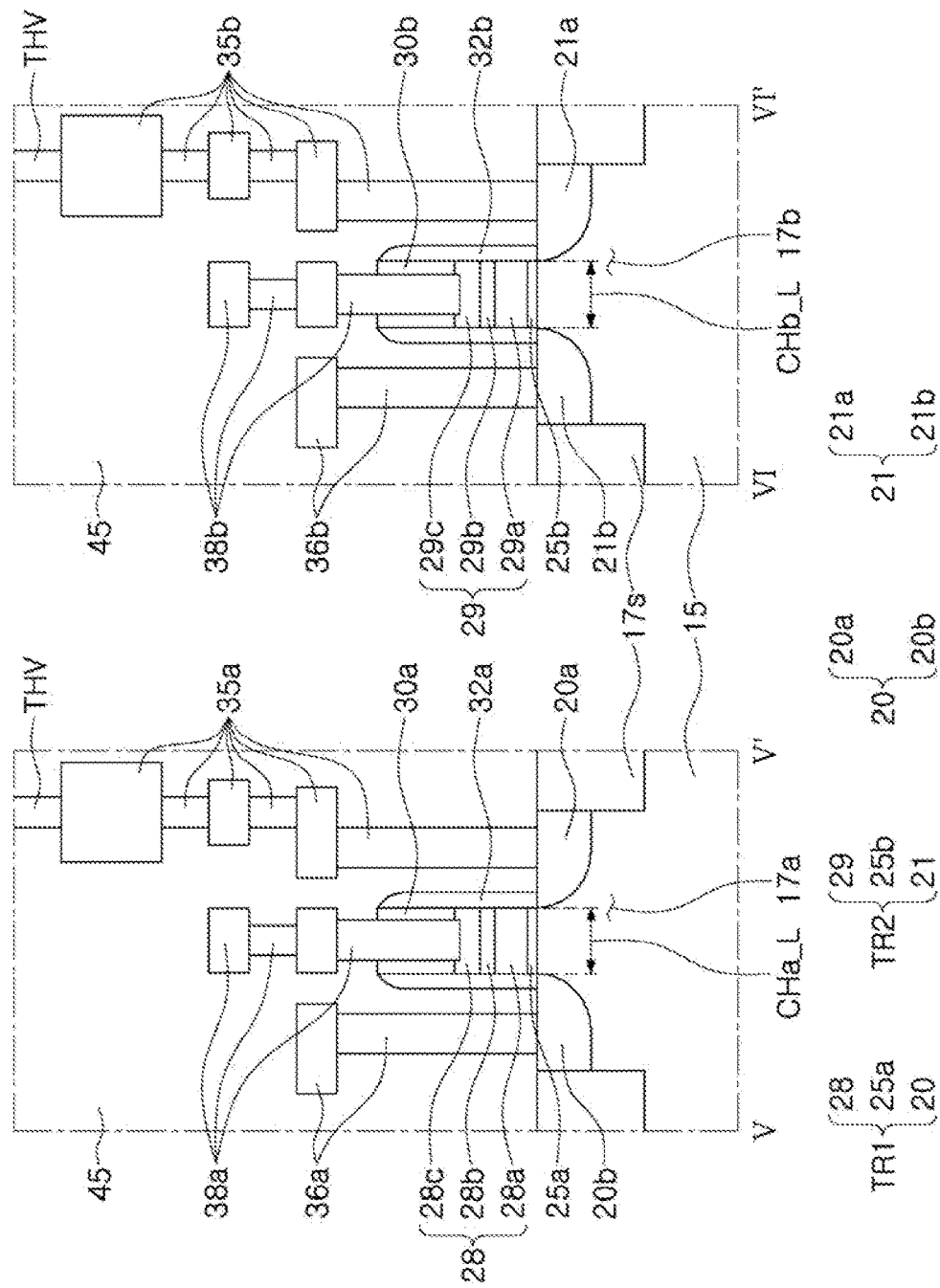
Figure 10C:
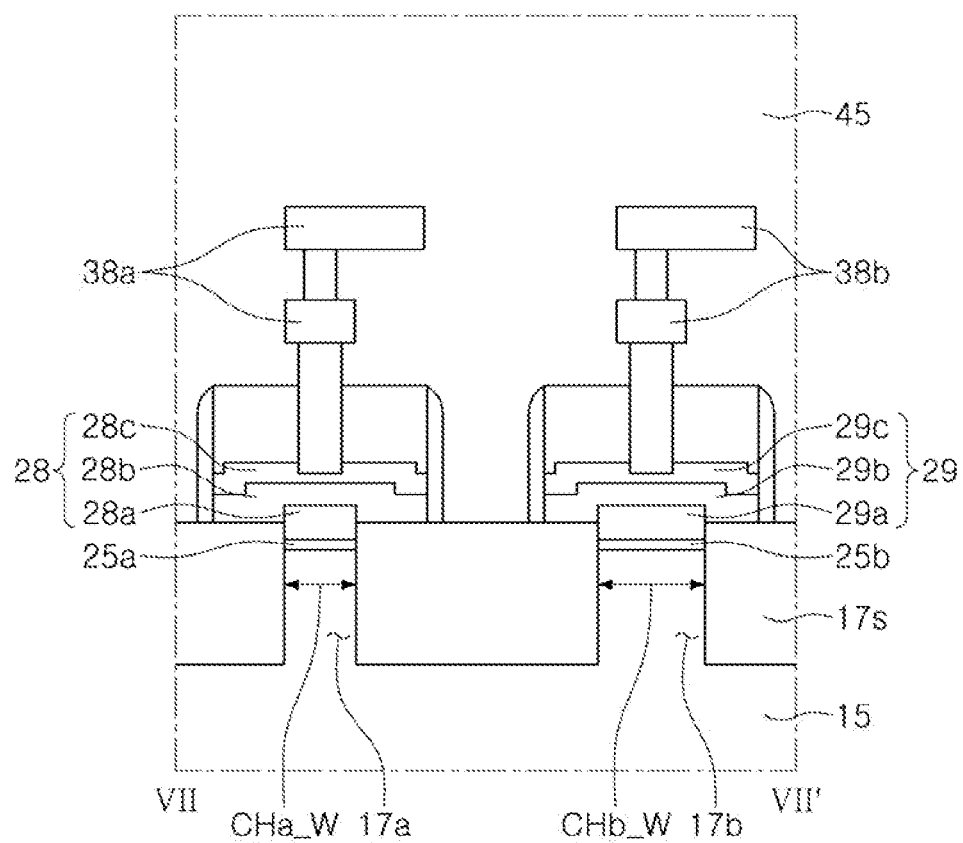

In FIGS. 10A to 10C, FIG. 10A is a plan view illustrating an example plan shape of the second structure 10 described above, FIG. 10B is a cross-sectional view illustrating regions taken along lines V-V' and VI-VI' of FIG. 10A, and FIG. 10C is a cross-sectional view illustrating a region taken along line VII-VII' of FIG. 10A.

Referring to FIGS. 10A to 10C, the second structure 10 may include a semiconductor substrate 15, and a device isolation layer 17s defining a first active region 17a and a second active region 17b on the semiconductor substrate 15.

The second structure 10 may further include a first impurity region 20a and a second impurity region 20b, spaced apart from each other in the first active region 17a. The second structure 10 may further include first channel regions CHa_W and CHa_L between the first impurity region 20a and the second impurity region 20b. The second structure 10 may further include a first gate (25a and 28) disposed on the first channel regions CHa_W and CHa_L and extending onto the device isolation layer 17s.

The second structure 10 may further include a third impurity region 21a and a fourth impurity region 21b, spaced apart from each other in the second active region 17b. The second structure 10 may further include second channel regions CHb_W and CHb_L between the third impurity region 21a and the fourth impurity region 21b. The second structure 10 may further include a second gate (25b and 29) disposed on the second channel regions CHb_W and CHb_L and extending onto the device isolation layer 17s.

The second structure 10 may further include a first gate capping insulating layer 30a on a first gate electrode 28, and a second gate capping insulating layer 30b on a second gate electrode 29.

The second structure 10 may further include a first gate spacer 32a covering side surfaces of the first gate electrode 28 and side surfaces of the first gate capping insulating layer 30a, which are sequentially stacked. The second structure 10 may further include a second gate spacer 32b covering side surfaces of the second gate electrode 29 and side surfaces of the second gate capping insulating layer 30b, which are sequentially stacked.

The first and second impurity regions 20a and 20b may be sources/drains. The third and fourth impurity regions 21a and 21b may be sources/drains.

The first gate (25a and 28) may include a first gate dielectric layer 25a and a first gate electrode 28 on the first gate dielectric layer 25a. The second gate (25b and 29) may include a second gate dielectric layer 25b and a second gate electrode 29 on the second gate dielectric layer 25b.

The first and second gate electrodes 28 and 29 may be formed of the same material and may have substantially the same structure. For example, each of the first and second gate electrodes 28 and 29 may include a first electrode layer (28a and 29a), a second electrode layer (28b and 29b) on the first electrode layer (28a and 29a), and a third electrode layers (28c and 29c) on the second electrode layer (28b and 29b).

The first electrode layer 28a of the first gate electrode 28 may have a side surface aligned with a side surface of the first active region 17a. The first electrode layer 29a of the second gate electrode 29 may have a side surface aligned with a side surface of the second active region 17b.

The first electrode layer (28a and 29a) may include a doped polysilicon layer.

The second electrode layer (28b and 29b) may be aligned with the side surface of the first electrode layer (28a and 29a) in the cross-sectional structure as in FIG. 10B, and may cover a portion of the side surface of the first electrode layer (28a and 29a) in the cross-sectional structure as in FIG. 10C.

The second electrode layer (28b and 29b) may include a doped polysilicon layer.

The third electrode layer (28c and 29c) may have a side surface aligned with a side surface of the second electrode layer (28b and 29b).

The third electrode layer (28c and 29c) may be formed of a material having a lower resistance than polysilicon, for example, at least one of a metal nitride (e.g., TiN and the like), a metal (e.g., W and the like), or a metal-semiconductor compound (e.g., TiSi and the like).

The first and second impurity regions 20a and 20b, the first channel regions CHa_W and CHa_L, and the first gate (25a and 28) may constitute a first transistor TR1.

The third and fourth impurity regions 21a and 21b, the second channel regions CHb_W and CHb_L, and the second gate (25b and 29) may constitute a second transistor TR2.

The second channel regions CHb_W and CHb_L may be larger than the first channel regions CHa_W and CHa_L. For example, a channel width CHb_W of the second channel regions CHb_W and CHb_L may be wider than a channel width CHa_W of the first channel regions CHa_W and CHa_L, and a channel length CHb_L of the second channel regions CHb_W and CHb_L may be substantially equal to a channel length CHa_L of the first channel regions CHa_W and CHa_L. Therefore, the second transistor TR2 may have superior current driving capability as compared to the first transistor TR1.

Each of the common pass transistors WPT2 described above with reference to FIGS. 1, 2A, and 2B may be the second transistor TR2. Each of the individual pass transistors WPT1 may be the first transistor TR1.

The second structure 10 may further include wiring structures 35a, 36a, and 38a electrically connected to the first transistor TR1, wiring structures 35b, 36b, and 38b electrically connected to the second transistor TR2, and a lower insulating layer 45 covering the wiring structures 35a, 36a, 38a, 35b, 36b, and 38b on the semiconductor substrate 15.

A first wiring structure 35a electrically connected to the first impurity region 20a, among the wiring structures 35a, 36a, and 38a electrically connected to the first transistor TR1, and a second wiring structure 35b electrically connected to the third impurity region 21a, among the wiring structures 35b, 36b, and 38b electrically connected to the second transistor TR2, may be in contact with and electrically connected to the above-described through-electrodes (THV of FIG. 5).

The first and second wiring structures 35a and 35b may constitute wiring connection structures (INTS of FIGS. 2A and 2B), together with the through-electrodes THV and the connection wirings INS, described above.

Next, the second upper common pad region P5, the first upper common pad region P4, and the first lower individual pad region P3a, described in FIGS. 5 and 6A, may be arranged sequentially in the first positive direction (+X). However, the arrangement of the second upper common pad region P5, the first upper common pad region P4, and the first lower individual pad region P3a may be changed. In this manner, an embodiment in which arrangement of the second upper common pad region P5, the first upper common pad region P4, and the first lower individual pad region P3a, described with reference to FIGS. 5 and 6A, is changed will be described with reference to FIGS. 11 and 12.

Figure 11:
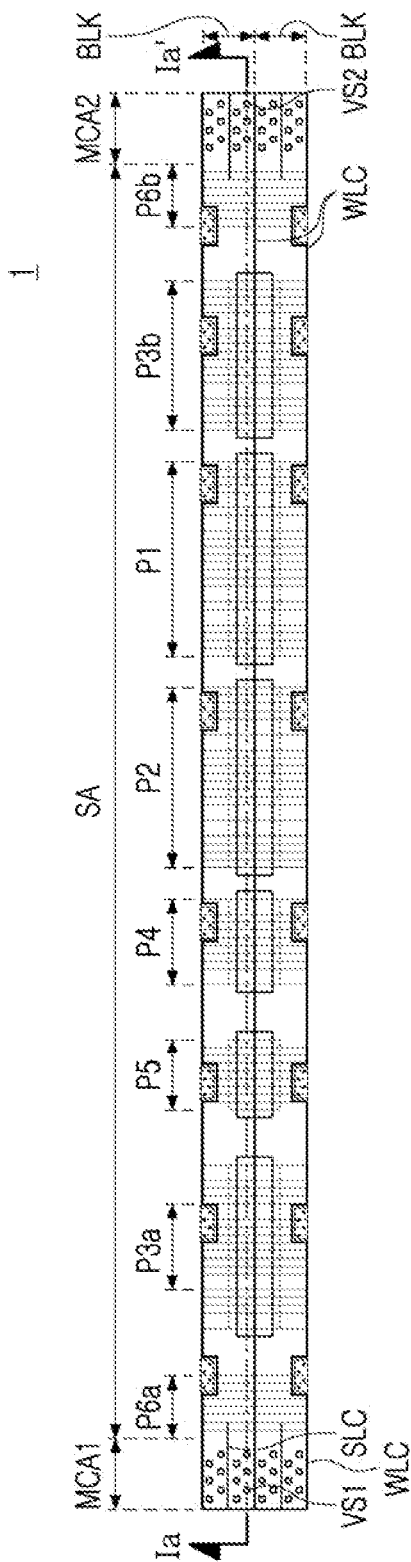
FIGS. 11 and 12 are views conceptually illustrating a modified example of a semiconductor device according to an example embodiment.
Figure 12:
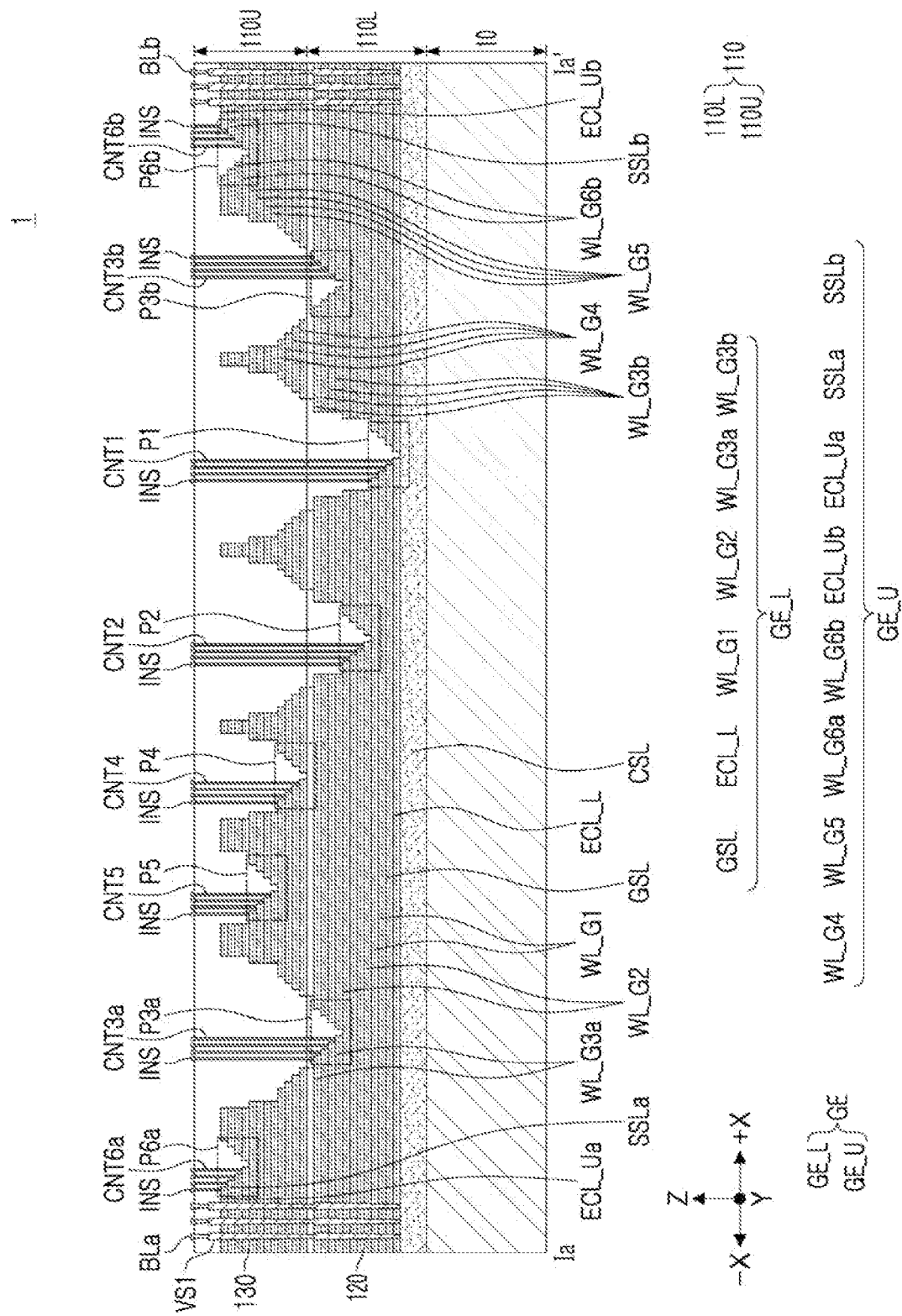

FIG. 11 is a plan view of an embodiment in which arrangement of the second upper common pad region P5, the first upper common pad region P4, and the first lower individual pad region P3a in the plan view of FIG. 5 is changed. FIG. 12 is a cross-sectional view taken along line Ia-Ia' of FIG. 11, and is an embodiment in which arrangement of the second upper common pad region P5, the first upper common pad region P4, and the first lower individual pad region P3a in the cross-sectional view of FIG. 6A is changed.

In the present modified example, referring to FIGS. 11 and 12, the second upper common pad region P5, the first upper common pad region P4, and the first lower individual pad region P3a, sequentially arranged in the first positive direction (+X), described with reference to FIGS. 5 and 6A, may be changed as in FIGS. 11 and 12. For example, the first lower individual pad region P3a, the second upper common pad region P5, and the first upper common pad region P4 may be sequentially disposed in the first positive direction (+X).

As arrangement of the first lower individual pad region P3a, the second upper common pad region P5, and the first upper common pad region P4 is changed, the second upper common contact plugs CNT5, the first upper common contact plugs CNT4, and the first intermediate individual contact plugs CNT3a arranged in the positive direction (+X) in FIGS. 5 and 6A may be changed as in FIGS. 11 and 12. For example, the first intermediate individual contact plugs CNT3a, the second upper common contact plugs CNT5, and the first upper common contact plugs CNT4 may be sequentially arranged in the first positive direction (+X), as illustrated in FIGS. 11 and 12.

Next, modified examples of the lower select gate electrode GSL and the lower erase control gate electrode ECL_L, described above, will be described with reference to FIGS. 13 to 15.

Figure 13:
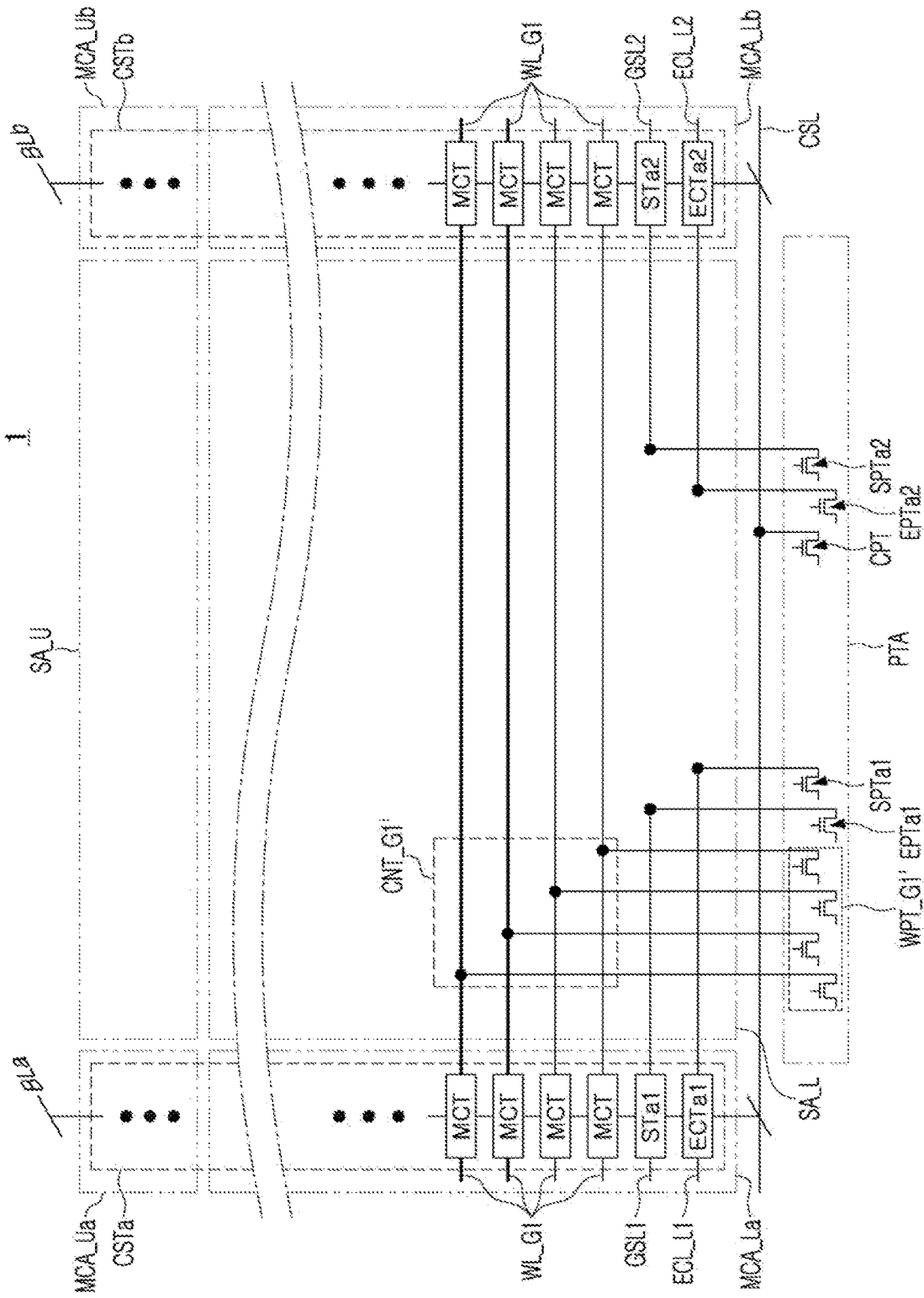
FIGS. 13 to 15 are views conceptually illustrating a modified example of a semiconductor device according to an example embodiment.
Figure 14:
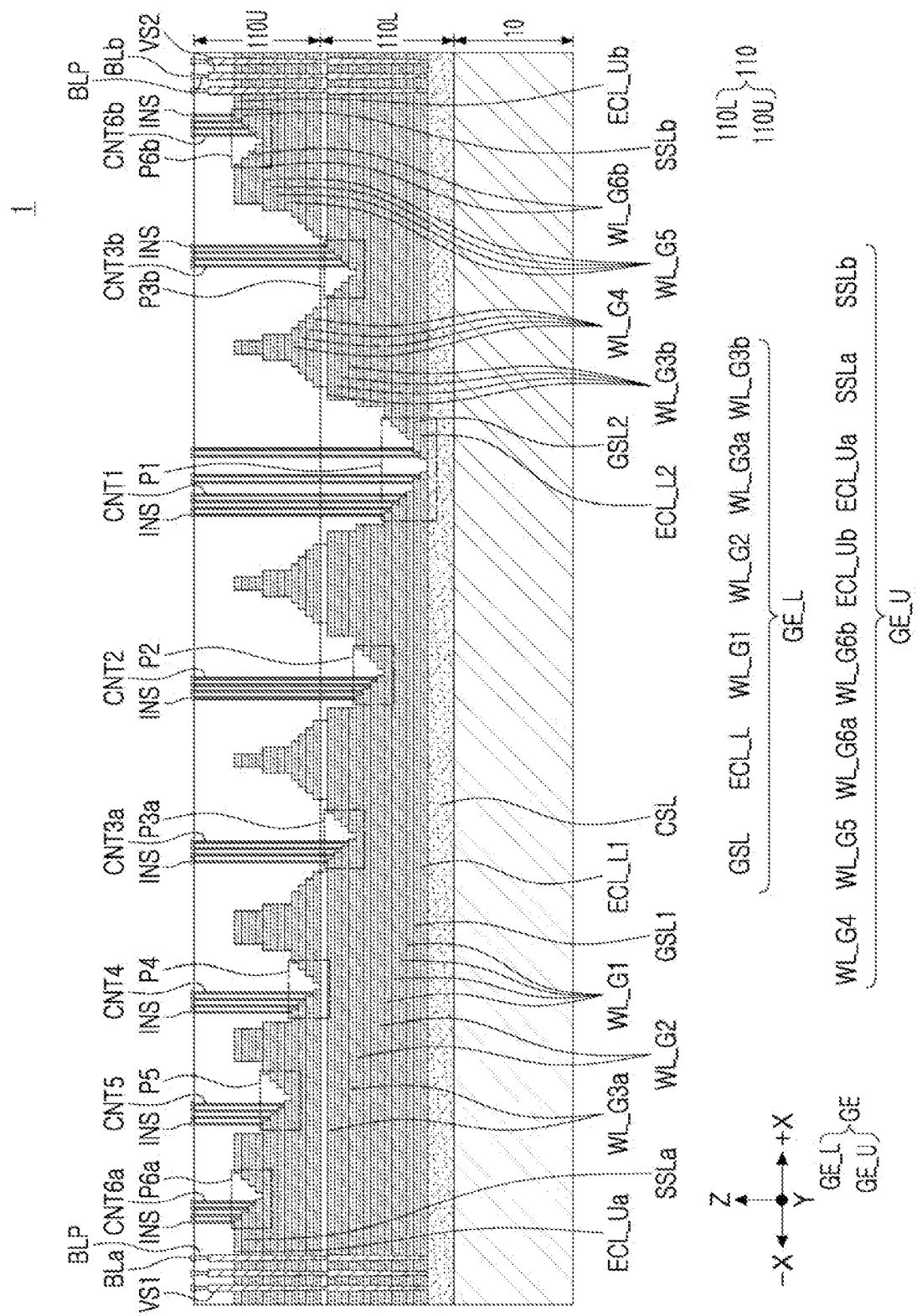
Figure 15:
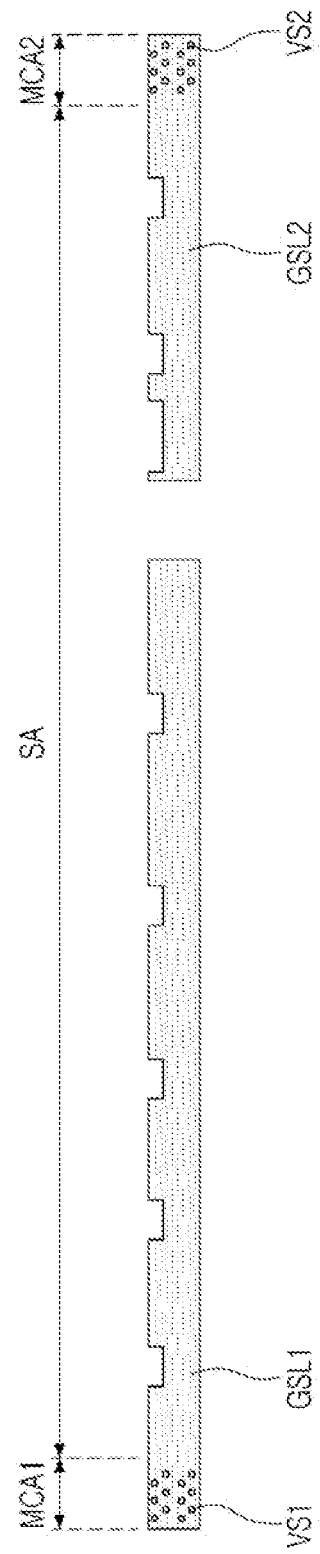

In FIGS. 13 to 15, FIG. 13 is a view illustrating a modified example in which the lower select gate electrode GSL and the lower erase control gate electrode ECL_L in FIG. 2B is changed, FIG. 14 is a cross-sectional view illustrating an example to which the modified lower select gate electrode and the modified lower erase control gate in FIG. 13, from the cross-sectional structure of FIG. 6A, are applied, and FIG. 15 is a plan view illustrating the modified lower select gate electrode in FIGS. 13 and 14.

Referring to FIGS. 13 to 15, in the example embodiment, any one of the lower select gate electrode (GSL of FIGS. 2B and 6A) and the lower erase control gate electrode (ECL_L of FIGS. 2B and 6A), described above, may be changed, as in FIGS. 13 and 14, and the other one thereof may not be changed.

In another example, the lower select gate electrode (GSL of FIGS. 2B and 6A) and the lower erase control gate electrode (ECL_L of FIGS. 2B and 6A), described above, may be changed as in FIGS. 13 and 14.

The lower select gate electrode (GSL of FIGS. 2B and 6A), described above, may be to be changed as a first lower select gate electrode GSL1 and a second lower select gate electrode GSL2, separated from each other in an extension region SA.

The first lower gate electrode GSL1 may extend from a first memory region MCA1, and may extend into a portion of the extension region SA. The second lower gate electrode GSL2 may extend from a second memory region MCA2, and may extend into a portion of the extension region SA. The first lower select gate electrode GSL1 and the second lower select gate electrode GSL2 may have opposite end portions, and may be electrically separated from each other.

The lower erase control gate electrode (ECL_L in FIGS. 2B and 6A), described above, may be changed as a first lower erase control gate electrode ECL_L1 and a second lower erase control gate electrode ECL_L2, separated from each other in the extension region SA.

The first lower erase control gate electrode ECL_L1 may extend from the first memory region MCA1, and may extend into a portion of the extension region SA. The second lower erase control gate electrode ECL_L2 may extend from the second memory region MCA2, and may extend into a portion of the extension region SA. The first lower erase control gate electrode ECL_L1 and the second lower erase control gate electrode ECL_L2 may have opposite end portions, and may be electrically separated from each other.

Next, a modified example of the common source region CSL, described above, will be described with reference to FIGS. 16 and 17.

Figure 16:
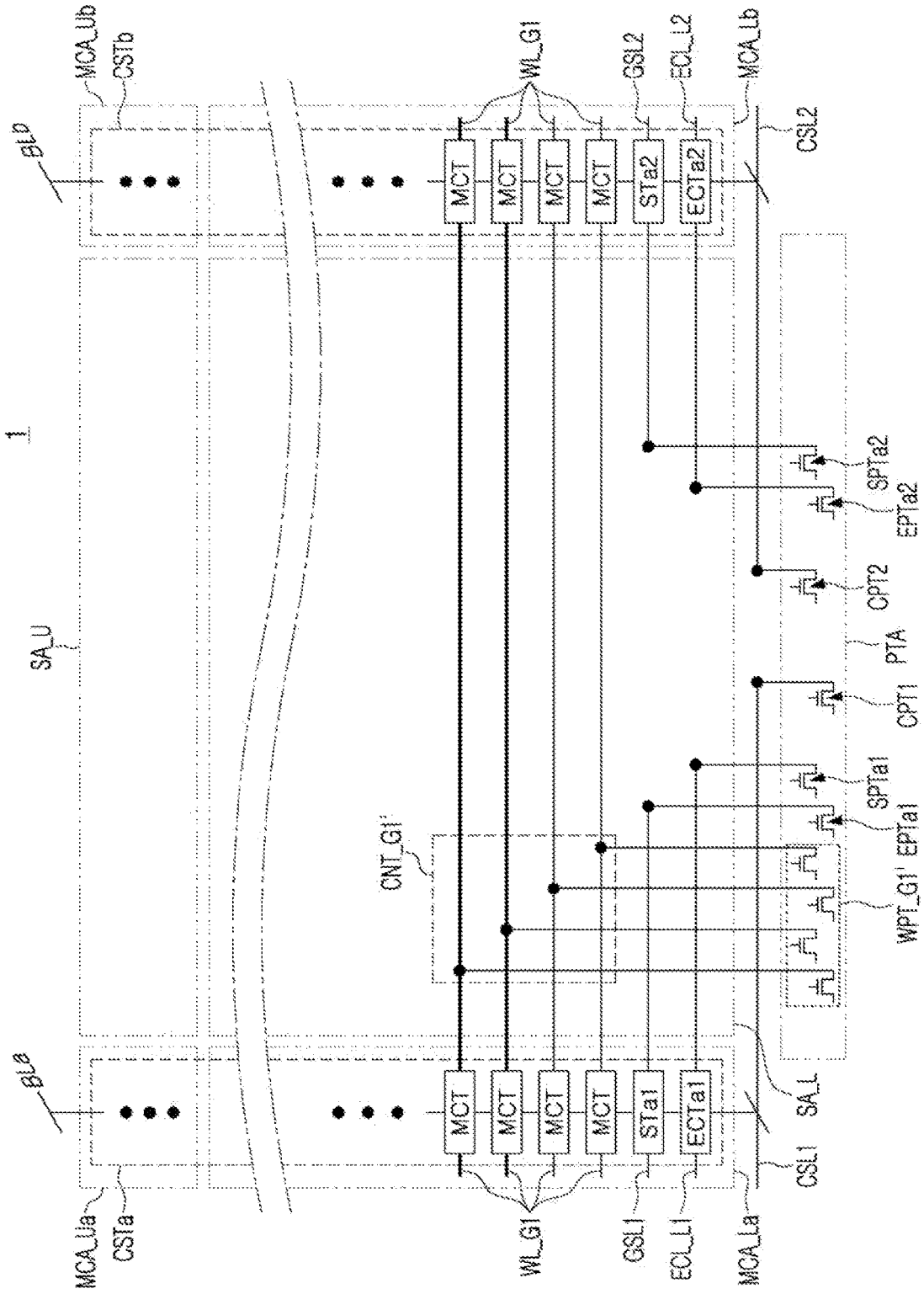
FIGS. 16 and 17 are views conceptually illustrating a modified example of a semiconductor device according to an example embodiment.
Figure 17:
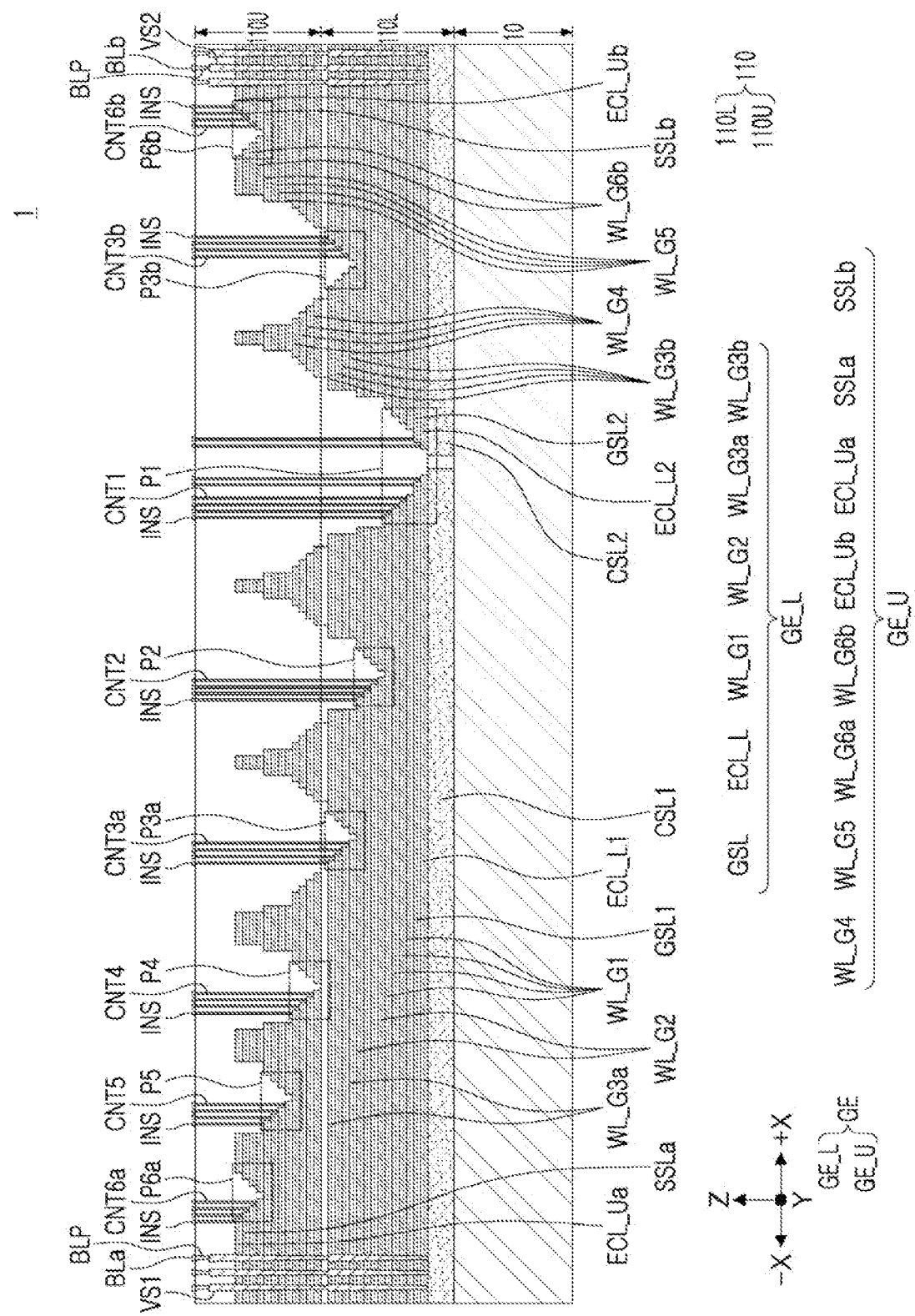
Figure 18:
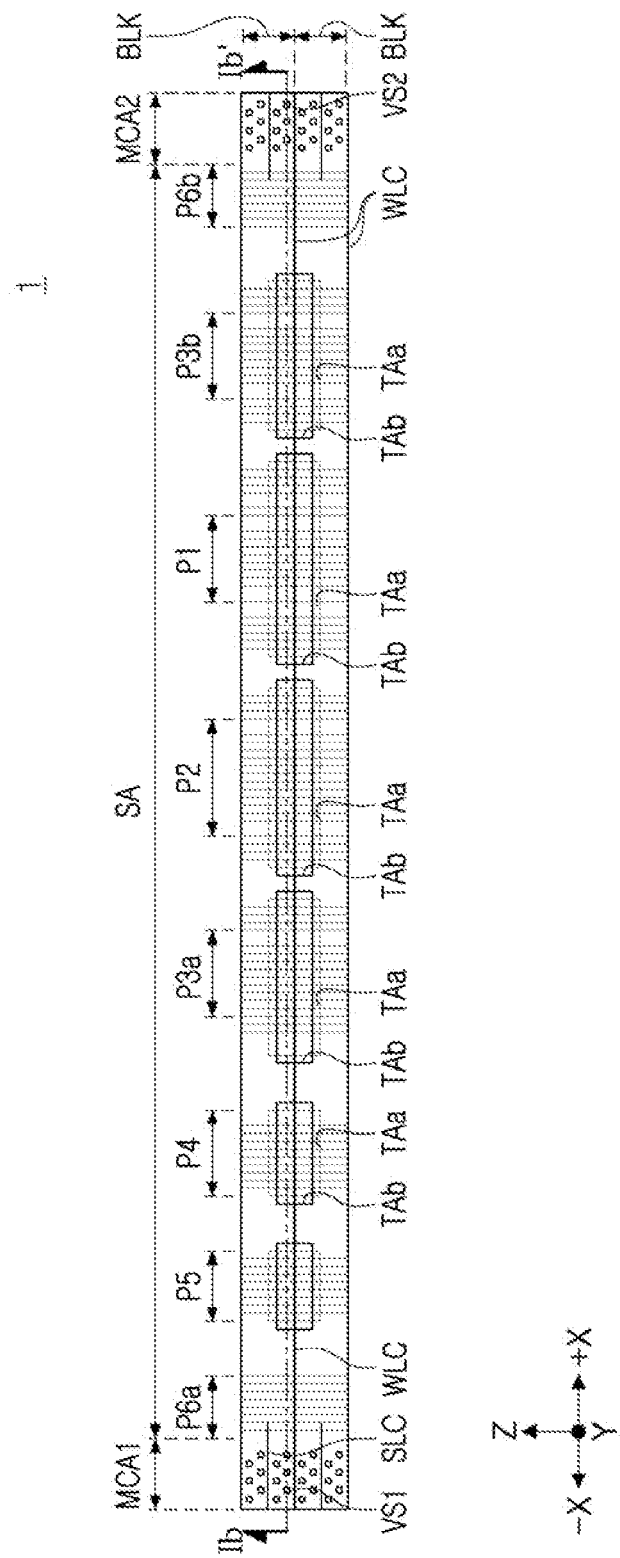
FIGS. 18 to 20B are views conceptually illustrating a modified example of a semiconductor device according to an example embodiment.

In FIGS. 16 and 17, FIG. 16 is a view illustrating a modified example of the common source region CSL in FIGS. 2A, 2B, and 13, and FIG. 17 is a cross-sectional view illustrating a modified example of the common source region CSL in the cross-sectional structure of FIG. 14.

Referring to FIGS. 16 and 17, the common source region CSL, described above, may be changed as a first common source region CSL1 and a second common source region CSL2, spaced apart from each other and electrically separated from each other in the extension region SA, as in FIGS. 16 and 17.

Next, modified examples of the contact plugs CNT1, CNT2, CNT3a, CNT3b, CNT4, CNT5, CNT6a, and CNT6b, described above, will be described with reference to FIGS. 18, 19, 20A, and 20B.

Figure 19:
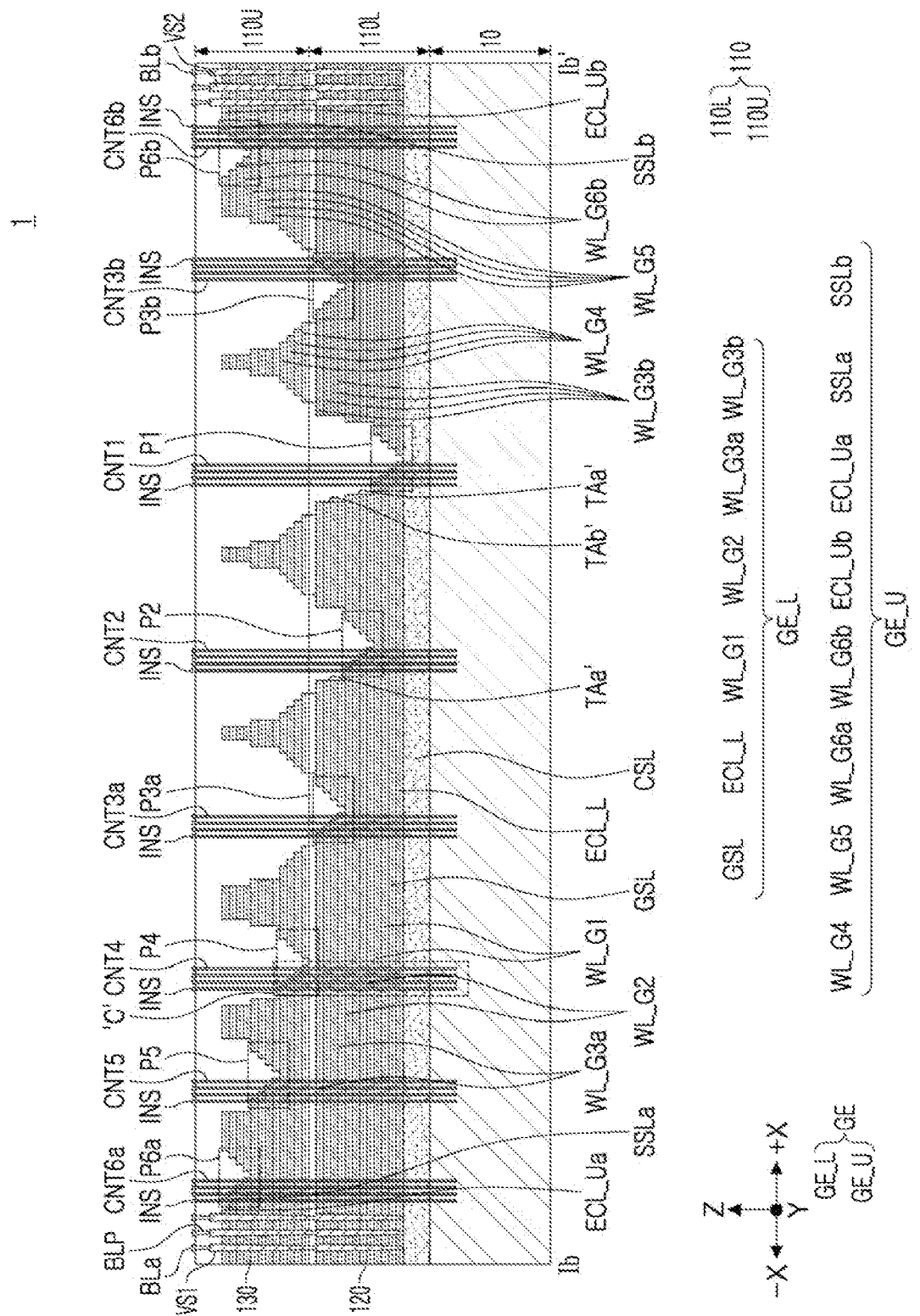
Figure 20A:
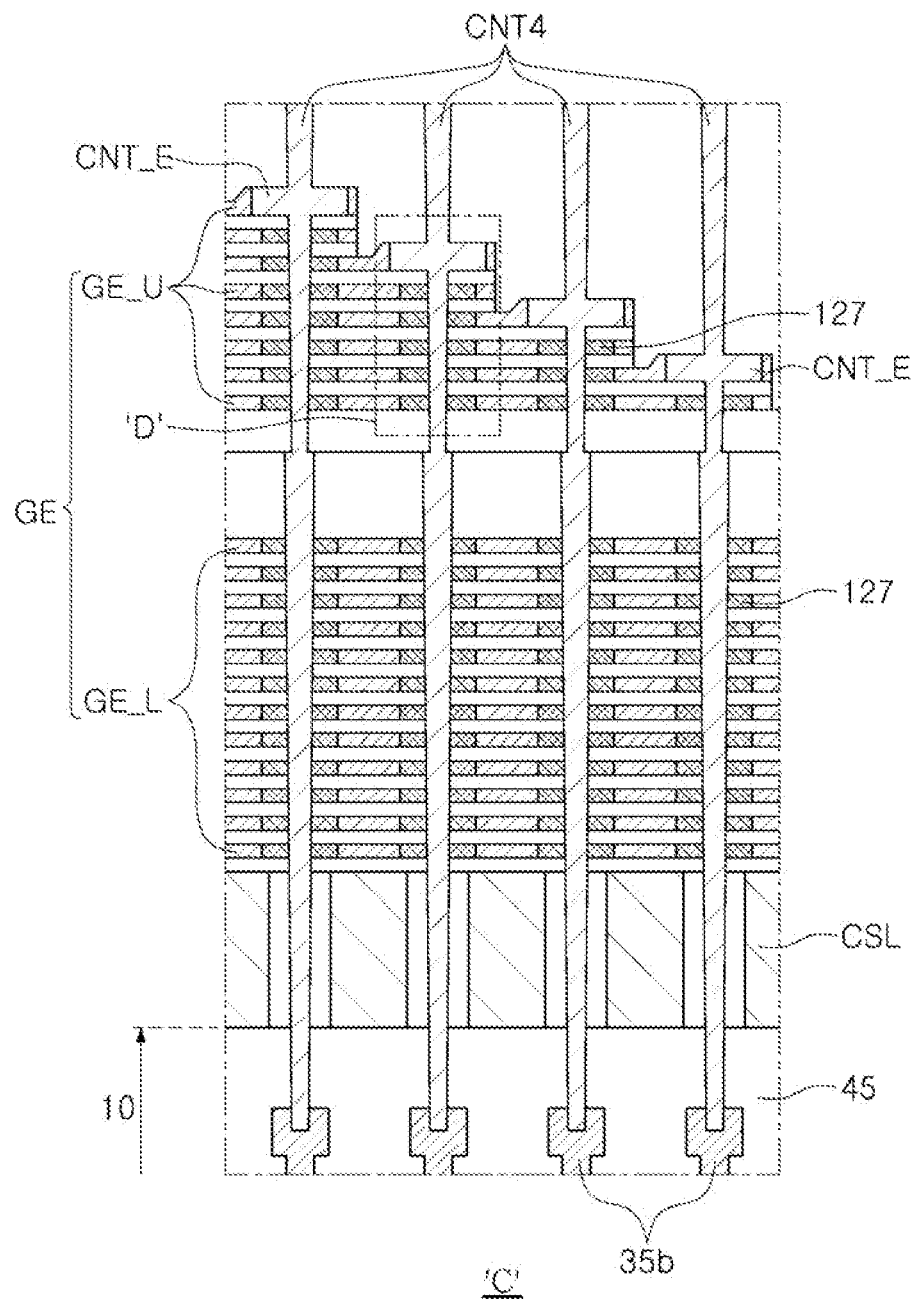
Figure 20B:
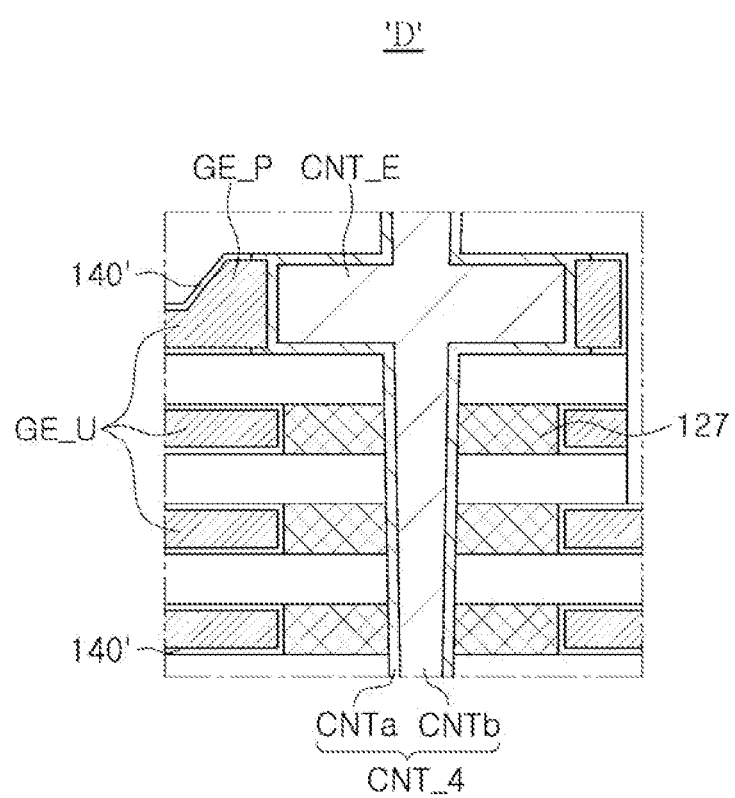

In FIGS. 18, 19, 20A, and 20B, FIG. 18 is a plan view illustrating the modified portion in FIG. 5, FIG. 19 is a cross-sectional view illustrating a region taken along line Ib-Ib' in FIG. 8, and illustrates modified examples of the contact plugs CNT1, CNT2, CNT3a, CNT3b, CNT4, CNT5, CNT6a, and CNT6b in FIG. 6A, FIG. 20A is a partially enlarged view illustrating portion 'C' in FIG. 19, and FIG. 20B is a partially enlarged view illustrating portion 'D' in FIG. 20A.

Referring to FIGS. 18, 19, 20A, and 20B, the dam structure DAM, the through-wiring region TIA, and the through-electrodes THV, described above, may be omitted, and the contact plugs CNT1, CNT2, CNT3a, CNT3b, CNT4, CNT5, CNT6a, and CNT6b, described above, may be changed to pass through pads GE_P of the gate electrodes GE, and may extend into the second structure 10, to contact the first and second wiring structures 35a and 35b as in FIG. 10B.

In each of the gate electrodes GE, the pad GE_P of the gate electrode GE may be thicker than the remaining portion of the gate electrode GE.

Each of the contact plugs CNT1, CNT2, CNT3a, CNT3b, CNT4, CNT5, CNT6a, and CNT6b may have an extension portion CNT_E contacting the pads GE_P of the gate electrodes GE.

Below the pads GE_P of the gate electrodes GE, buffer insulating layers 127 may be disposed between the contact plugs CNT1, CNT2, CNT3a, CNT3b, CNT4, CNT5, CNT6a, and CNT6b and the gate electrodes GE.

Similar to the dielectric layer 140 described with reference to FIG. 8A, a dielectric layer 140' may be disposed to cover an upper surface and a lower surface of each of the gate electrodes GE and to cover at least a portion of side surfaces thereof.

Next, although the examples described above describe that the first structure 110 as being disposed on the second structure 10, this may be varied. For example, the second structure 10 may be changed to be disposed on the first structure 110. An example of a second structure 10 disposed on a first structure 110 will be described with reference to FIGS. 21, 22, and 23.

Figure 21:
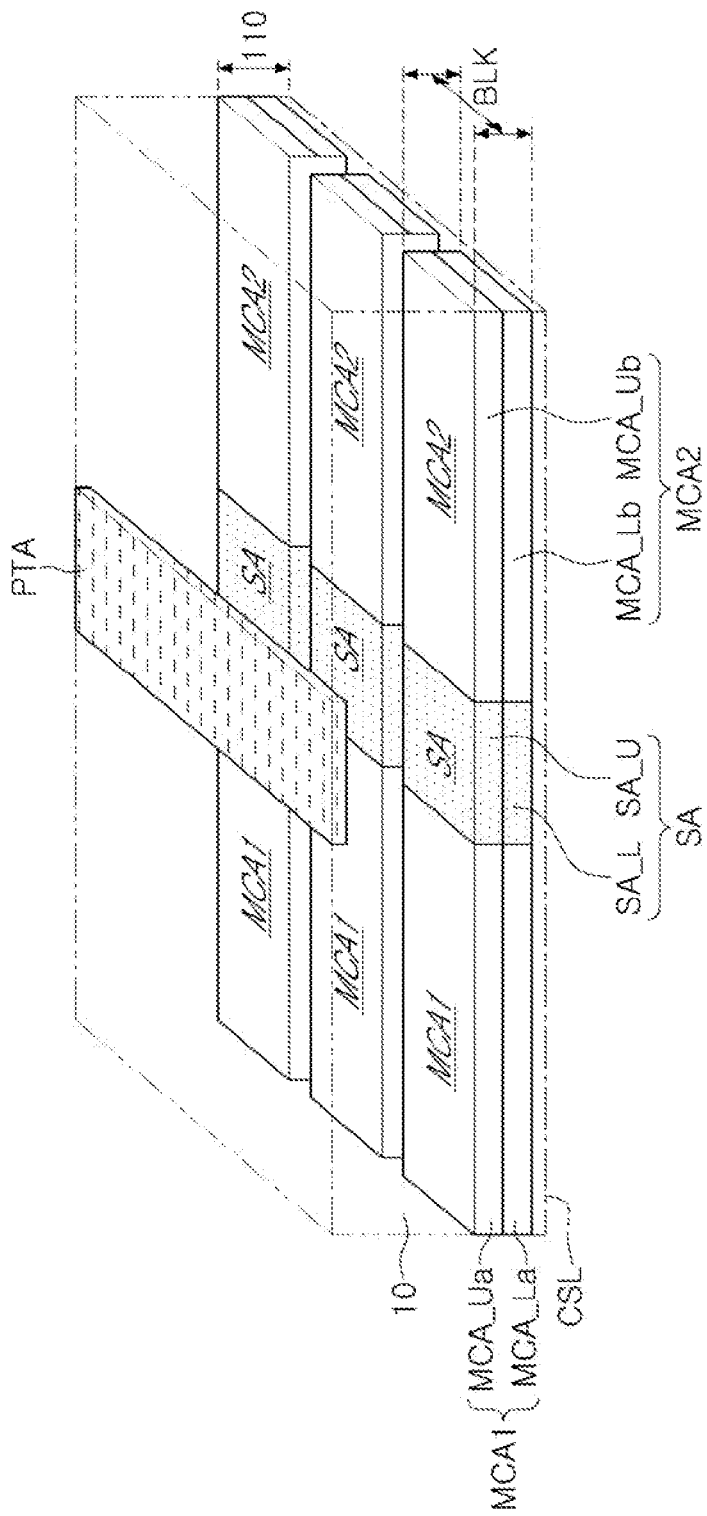
FIGS. 21 to 23 are views conceptually illustrating a modified example of a semiconductor device according to an example embodiment.
Figure 22:
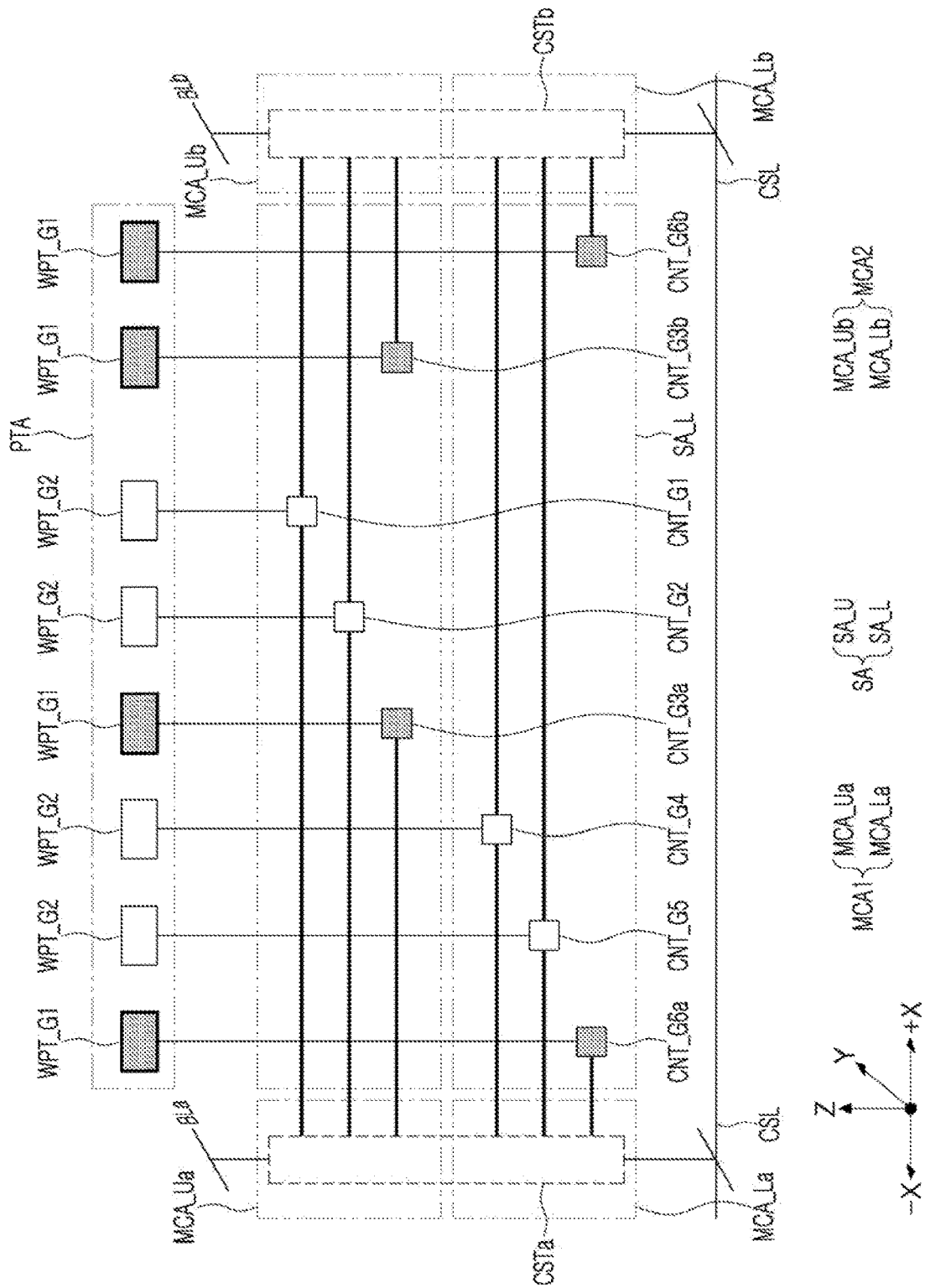
Figure 23:
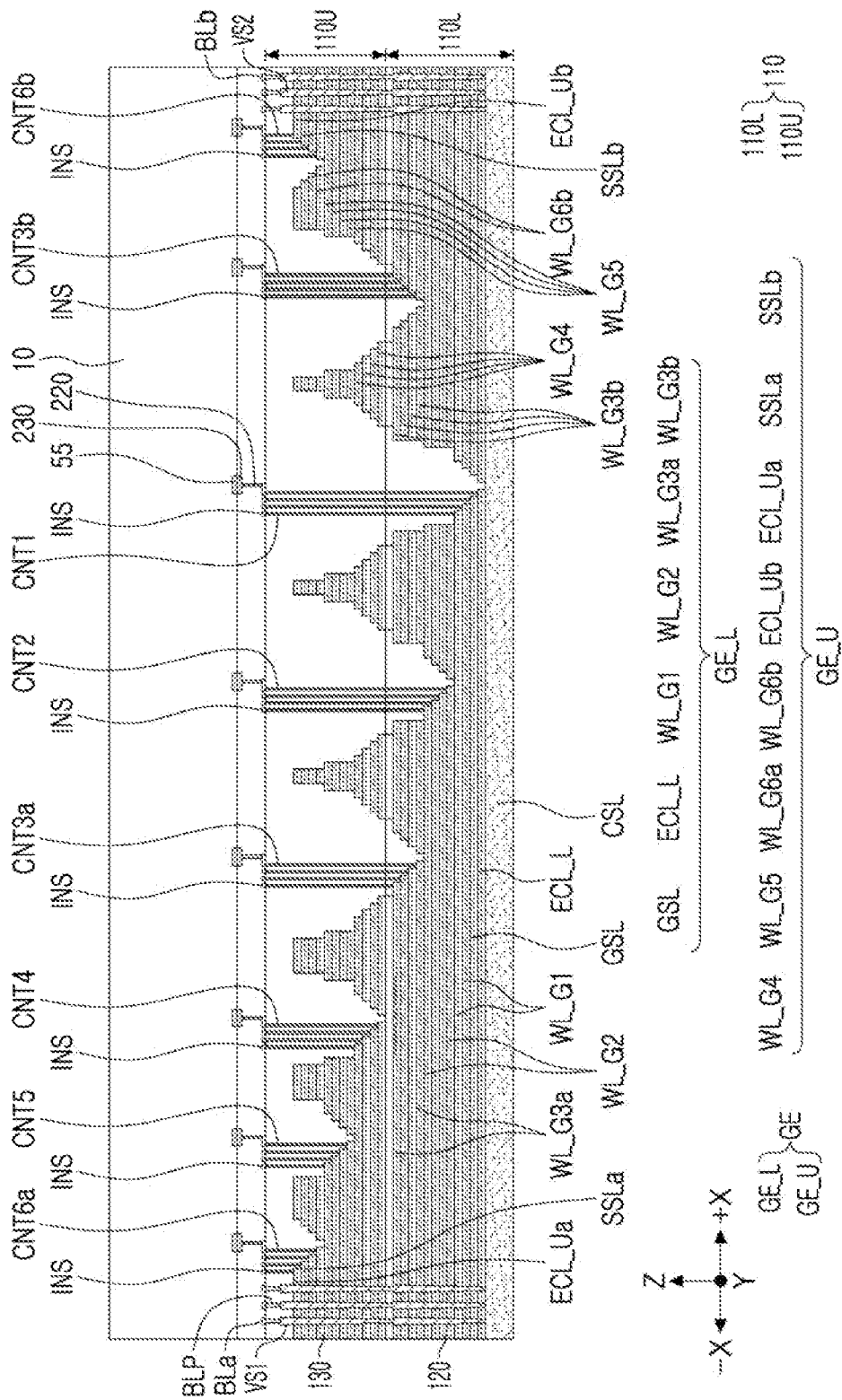

In FIGS. 21, 22, and 23, FIG. 21 is a perspective view illustrating a modified example in which the second structure 10 is disposed on the first structure 110 in the perspective view of FIG. 1, FIG. 22 is a view in which the circuit region PTA is changed to be located above the extension region SA in the view of FIG. 3, and FIG. 23 is a cross-sectional view in which the second structure 10 is changed to be located on the first structure 110 in the cross-sectional view of FIG. 6A.

Referring to FIGS. 21, 22, and 23, the second structure 10, described above, may be changed to be disposed on the first structure 110, described above.

A bonding structure (220 and 230) including upper wirings 220 and lower bonding pads 230 may be disposed on the first structure 110. The bonding structure (220 and 230) may be bonded to the second structure 10.

The upper wirings 220 may be electrically connected to the connection wirings (INS of FIG. 6A) disposed on the contact plugs (CNT1, CNT2, CNT3a, CNT3b, CNT4, CNT5, CNT6a, CNT6b of FIG. 6A), described above.

The second structure 10 may further include upper bonding pads 55 bonded to the lower bonding pads 230. The upper bonding pads 55 may be electrically connected to the first and second wiring structures 35a and 35b described with reference to FIG. 10B.

The wiring connection structures (INTS of FIGS. 2A and 2B), described above, may include the first and second wiring structures (35a and 35b of FIG. 10B), the lower and upper bonding pads 230 and 55, the upper wirings 220, and the connection wirings INS.

Next, an example method of forming a semiconductor device according to an example embodiment will be described with reference to FIGS. 24 and 25.

Figure 24:
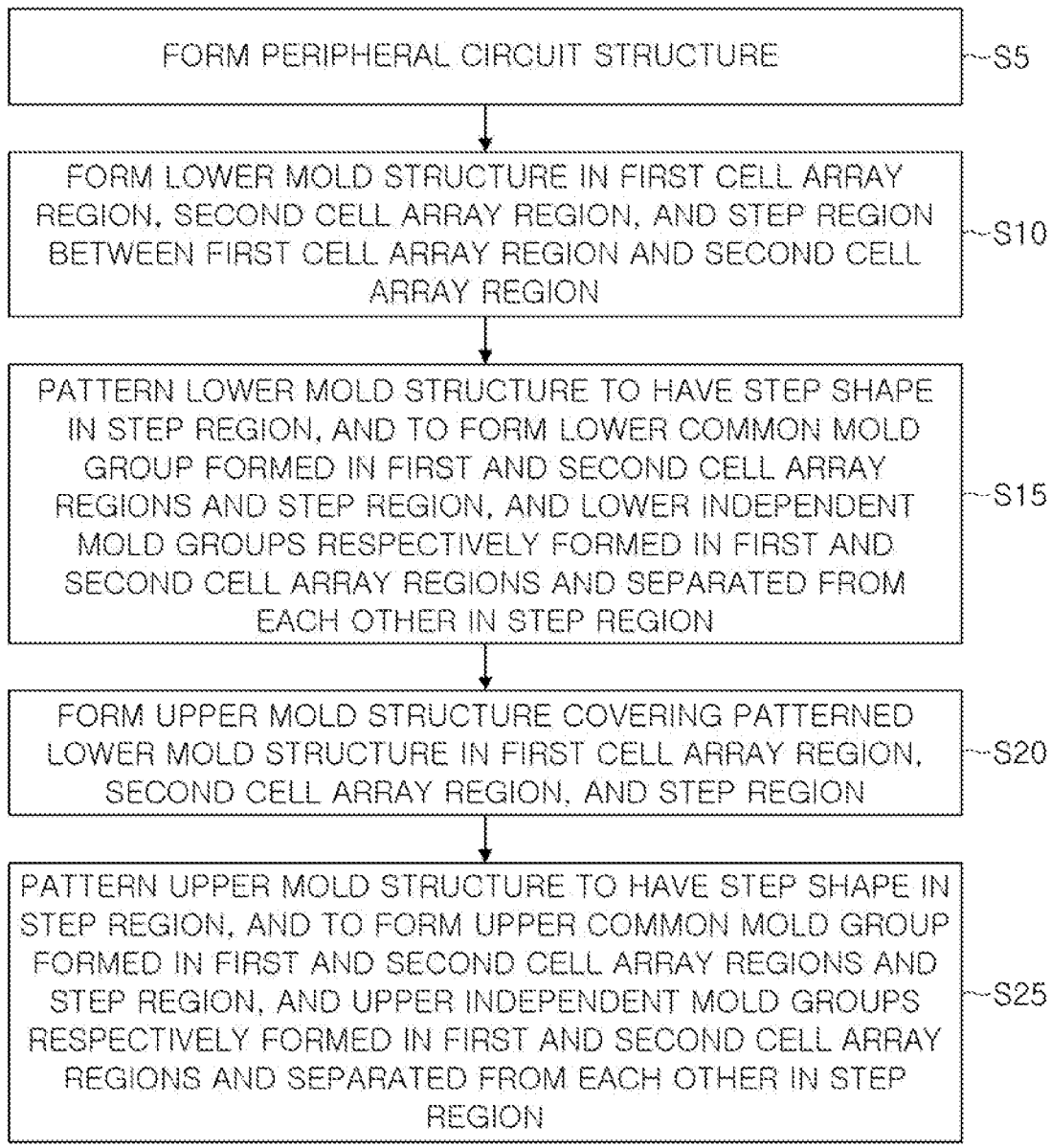
FIGS. 24 and 25 are process flowcharts schematically illustrating an example of a method of forming a semiconductor device according to an example embodiment.
Figure 25:
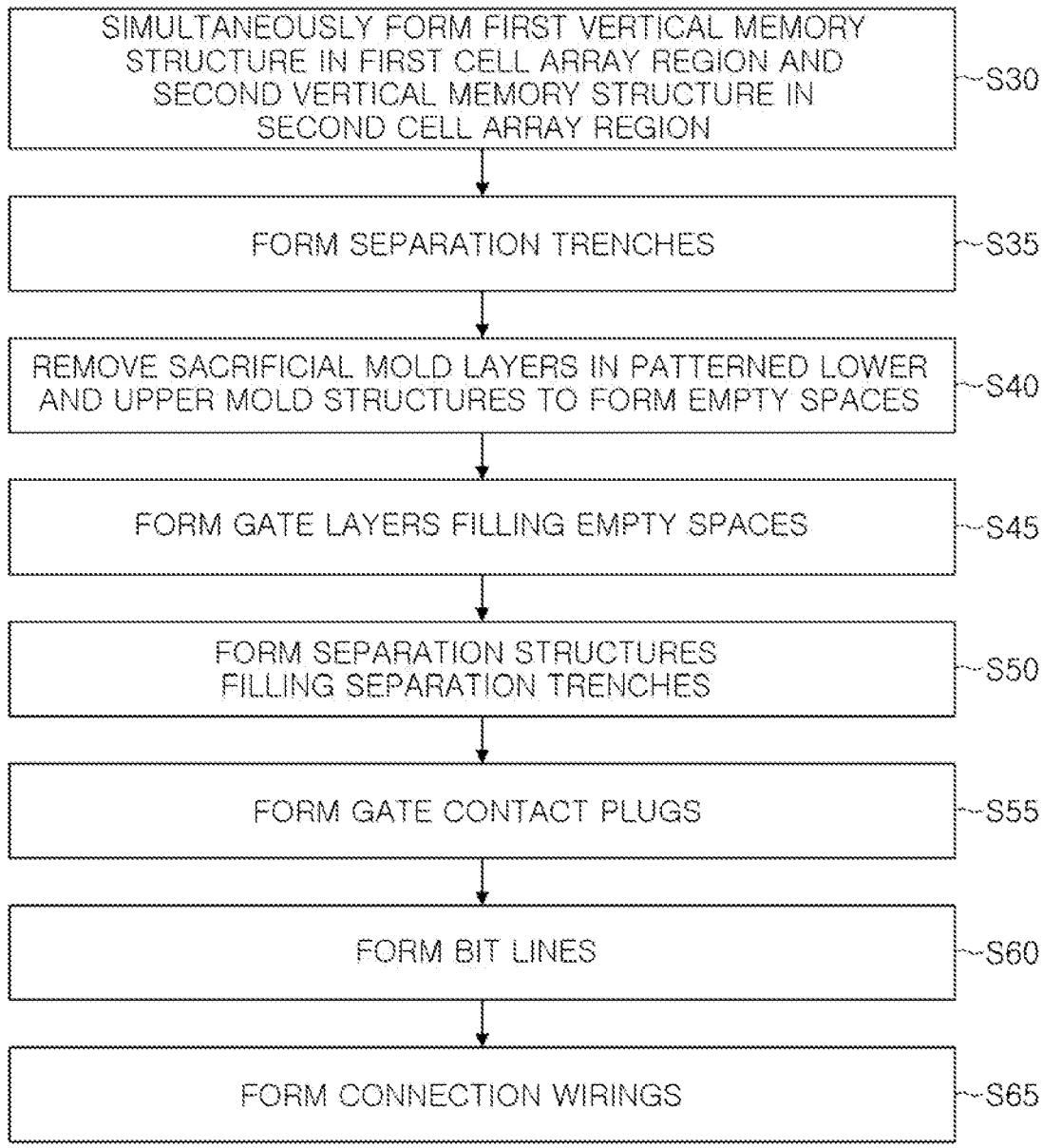

FIGS. 24 and 25 are process flowcharts schematically illustrating an example of a method of forming a semiconductor device according to an example embodiment.

Referring to FIGS. 24 and 25, a peripheral circuit structure may be formed (S5). The peripheral circuit structure may be the second structure 10 including the first and second transistors TR1 and TR2, the wiring structures 35a, 36a, 38a, 35b, 36b, and 38b, and the lower insulating layer 45, described with reference to FIGS. 10A to 10C.

A lower mold structure may be formed in a first cell array region, a second cell array region, and a step region in the first cell array region (S10).

The first cell array region may be a region for forming the first memory region MCA1, described above. The second cell array region may be a region for forming the second memory region MCA2, described above. The step region may be a region for forming the extension region SA, described above.

The lower mold structure may be patterned to have a step shape in the step region, and to form a lower common mold group formed over the first and second cell array regions and the step region, and lower independent mold groups respectively formed in the first and second cell array regions and separated from each other in the step region (S15). The patterning of the lower mold structure may include repeatedly performing photo and etching processes.

The lower mold structure may include interlayer insulating layers and mold layers, stacked alternately and repeatedly. Mold layers in the lower common mold group and the lower independent mold groups may be mold layers for forming the lower gate electrode GE_L in FIGS. 6A to 6C.

An upper mold structure covering the patterned lower mold structure may be formed in the first cell array region, the second cell array region, and the step region in the first cell array region (S20). The upper mold structure may be patterned to have a step shape in the step region, and to form an upper common mold group formed over the first and second cell array regions and the step region, and upper independent mold groups respectively formed in the first and second cell array regions and separated from each other in the step region (S25). The patterning of the upper mold structure may include repeatedly performing photo and etching processes.

The upper mold structure may include interlayer insulating layers and mold layers, stacked alternately and repeatedly. Mold layers in the upper common mold group and the upper independent mold groups may be mold layers for forming the upper gate electrode GE_U in FIGS. 6A to 6C.

A first vertical memory structure in a first cell array region and a second vertical memory structure in a second cell array region may be simultaneously formed (S30). The first and second vertical memory structures may be the first and second memory vertical structures VS1 and VS2 of FIGS. 5 to 8A.

Separation trenches may be formed (S35). The separation trenches may pass through the patterned lower and upper mold structures to expose sacrificial mold layers of the patterned lower and upper mold structures.

The sacrificial mold layers in the patterned lower and upper mold structures may be removed to form empty spaces (S40).

Gate layers filling the empty spaces may be formed (S45). The gate layers may include the gate electrodes GE as in FIGS. 6A to 8B.

Separation structures filling the separation trenches may be formed (S50). The separation structures may be the separation structures WLC in FIGS. 5, 6C, and 7.

Gate contact plugs may be formed (S55). The gate contact plugs may be the contact plugs CNT1, CNT2, CNT3a, CNT3b, CNT4, CNT5, CNT6a, and CNT6b in FIG. 6A.

Bit lines may be formed (S60). The bit lines may be the first and second bit lines BLa and BLb of FIGS. 6A to 6C.

Connection wirings may be formed (S65). The connection wirings may be the connection wirings INS described with reference to FIGS. 6A and 6C.

Next, a data storage system including a semiconductor device according to an example embodiment will be described with reference to FIGS. 26 and 27.

Figure 26:
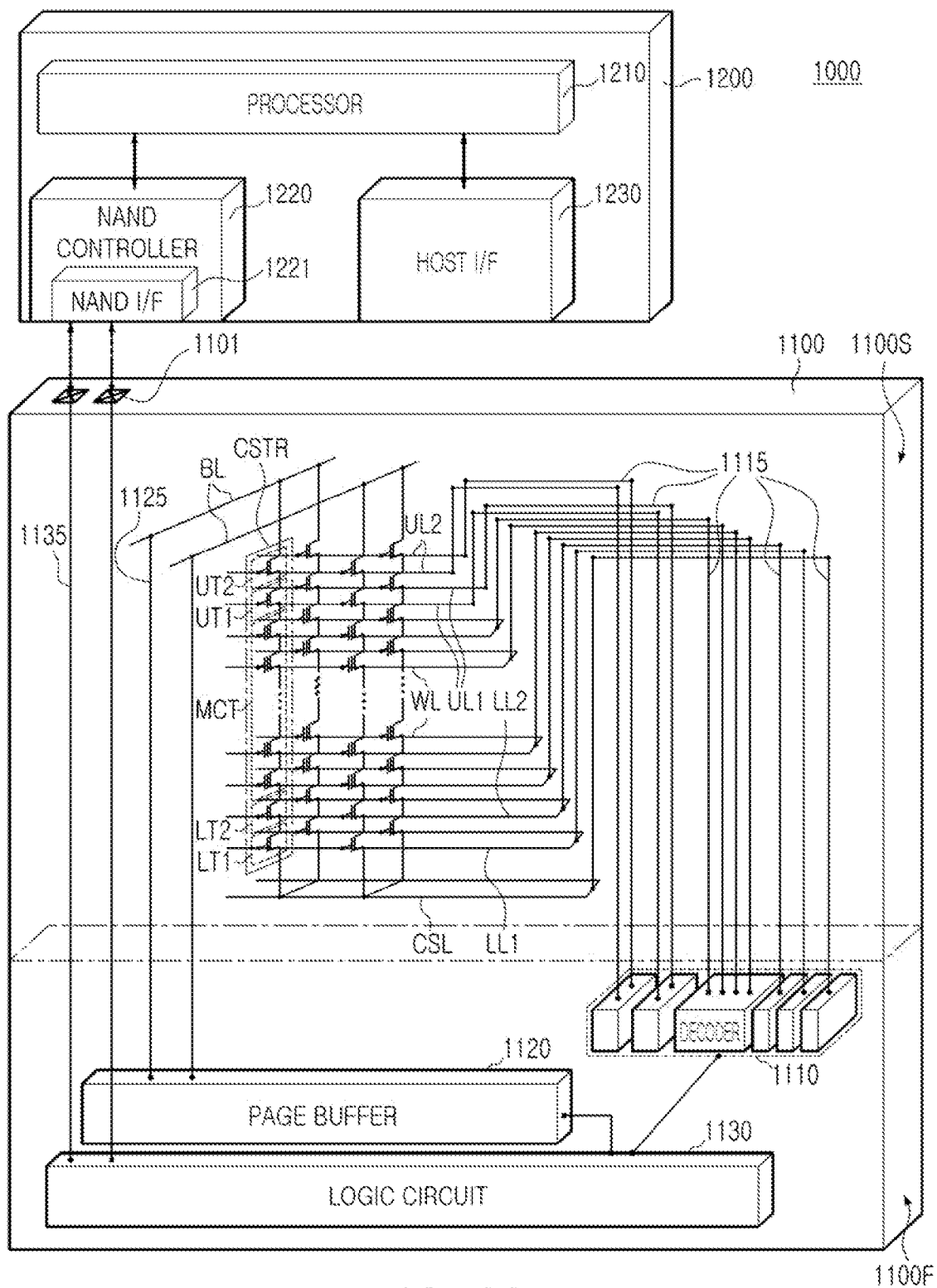
FIG. 26 is a view schematically illustrating a data storage system including a semiconductor device according to an example embodiment.

FIG. 26 is a view schematically illustrating a data storage system including a semiconductor device according to an example embodiment. FIG. 27 is a perspective view schematically illustrating a data storage system including a semiconductor device according to an example embodiment.

Referring to FIG. 26, a data storage system 1000 according to an example embodiment may include a semiconductor device 1100, and a controller 1200 electrically connected to the semiconductor device 1100 and controlling the semiconductor device 1100. The data storage system 1000 may be a storage device including the semiconductor device 1100, or an electronic device including a storage device. For example, the data storage system 1000 may be a solid state drive device (SSD), a universal serial bus (USB), a computing system, a medical device, or a communication device, including the semiconductor device 1100. In an example embodiment, the data storage system 1000 may be an electronic system storing data.

The semiconductor device 1100 may be a semiconductor device according to any one of the embodiments described above with reference to FIGS. 1 to 23.

The semiconductor device 1100 may include a second structure 1100F, and a first structure 1100S on the second structure 1100F.

The second structure 1100F may include a second structure 10, described above. The second structure 1100F may be a peripheral circuit structure including a decoder circuit 1110, a page buffer 1120, and a logic circuit 1130.

The first structure 1100S may be a memory cell structure including bit lines BL, a common source line CSL, word lines WL, first and second upper gate lines UL1 and UL2, first and second lower gate lines LL1 and LL2, and memory cell strings CSTR between each of the bit lines BL and the common source line CSL.

In the first structure 1100S, each of the memory cell strings CSTR may include lower transistors LT1 and LT2 adjacent to the common source line CSL, upper transistors UT1 and UT2 adjacent to each of the bit lines BL, and a plurality of memory cell transistors MCT disposed between each of the lower transistors LT1 and LT2 and each of the upper transistors UT1 and UT2. The number of lower transistors LT1 and LT2 and the number of upper transistors UT1 and UT2 may be variously changed according to example embodiments.

In example embodiments, each of the upper transistors UT1 and UT2 may include a string select transistor, and each of the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

The gate electrodes GE, described above, may constitute the lower gate lines LL1 and LL2, the word lines WL, and the upper gate lines UL1 and UL2.

In example embodiments, the lower transistors LT1 and LT2 may include a lower erase control transistor LT1 and a ground select transistor LT2, connected in series. The upper transistors UT1 and UT2 may include a string select transistor UT1 and an upper erase control transistor UT2, connected in series. At least one of the lower erase control transistor LT1 or the upper erase control transistor UT2 may be used for an erase operation of erasing data stored in the memory cell transistors MCT using a gate-induced-drain-leakage (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection wirings 1115 extending from the second structure 1100F into the first structure 1100S.

The bit lines BL may be electrically connected to the page buffer 1120 through second connection wirings 1125 extending from the second structure 1100F into the first structure 1100S.

In the second structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130.

The semiconductor device 1100 may further include an input/output pad 1101. The semiconductor device 1100 may communicate with the controller 1200 through the input/output pad 1101 electrically connected to the logic circuit 1130. The input/output pad 1101 may be electrically connected to the logic circuit 1130 through input/output connection wirings 1135 extending from the second structure 1100F into the first structure 1100S. Therefore, the controller 1200 may be electrically connected to the semiconductor device 1100 through the input/output pad 1101, and may control the semiconductor device 1100.

The controller 1200 may include a processor 1210, a NAND controller 1220, and a host interface 1230.

According to example embodiments, the data storage system 1000 may include a plurality of semiconductor devices 1100, and in this case, the controller 1200 may control the plurality of semiconductor devices 1100.

The processor 1210 may control an overall operation of the data storage system 1000 including the controller 1200. The processor 1210 may operate according to a predetermined firmware, and may access to the semiconductor device 1100 by controlling the NAND controller 1220.

The NAND controller 1220 may include a NAND interface 1221 processing communications with the semiconductor device 1100. A control command for controlling the semiconductor device 1100, data to be written to the memory cell transistors MCT of the semiconductor device 1100, data to be read from the memory cell transistors MCT of the semiconductor device 1100, or the like may be transmitted through the NAND interface 1221.

The host interface 1230 may provide a communication function between the data storage system 1000 and an external host. When a control command is received from the external host through the host interface 1230, the processor 1210 may control the semiconductor device 1100 in response to the control command.

Figure 27:
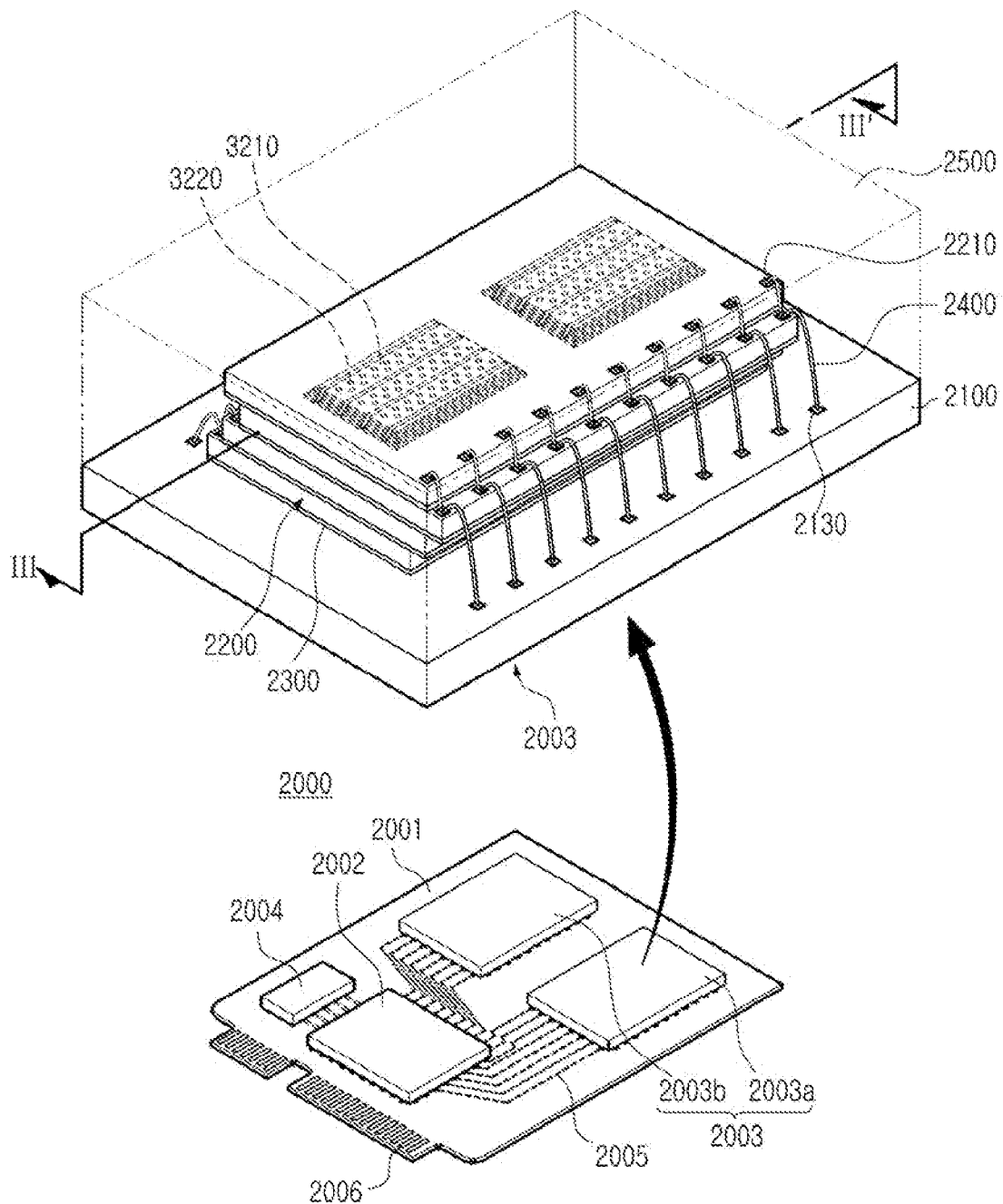
FIG. 27 is a perspective view schematically illustrating a data storage system including a semiconductor device according to an example embodiment.

Referring to FIG. 27, a data storage system 2000 according to an example embodiment may include a main substrate 2001, a controller 2002 mounted on the main substrate 2001, at least one semiconductor package 2003, and a DRAM 2004.

The semiconductor package 2003 and the DRAM 2004 may be connected to the controller 2002 by wiring patterns 2005 formed on the main substrate 2001.

The main substrate 2001 may include a connector 2006 including a plurality of pins, which may be coupled to an external host. The number and an arrangement of the plurality of pins in the connector 2006 may vary according to a communication interface between the data storage system 2000 and the external host. In example embodiments, the data storage system 2000 may communicate with the external host according to any one interface of a universal serial bus (USB), peripheral component interconnection express (PCI-Express), serial advanced technology attachment (SATA), M-Phy for universal flash storage (UFS), or the like.

In example embodiments, the data storage system 2000 may be operated by power supplied from the external host through the connector 2006.

The data storage system 2000 may further include a power management integrated circuit (PMIC) distributing power, supplied from the external host, to the controller 2002 and the semiconductor package 2003.

The controller 2002 may write data to the semiconductor package 2003 or read data from the semiconductor package 2003, and may improve an operation speed of the data storage system 2000.

The DRAM 2004 may be a buffer memory reducing a difference in speed between the semiconductor package 2003, which may be a data storage space, and the external host. The DRAM 2004 included in the data storage system 2000 may also operate as a type of cache memory, and may provide a space temporarily storing data in a control operation on the semiconductor package 2003. When the DRAM 2004 is included in the data storage system 2000, the controller 2002 may further include a DRAM controller controlling the DRAM 2004 in addition to a NAND controller controlling the semiconductor package 2003.

The semiconductor package 2003 may include first and second semiconductor packages 2003a and 2003b, spaced apart from each other. Each of the first and second semiconductor packages 2003a and 2003b may be a semiconductor package including a plurality of semiconductor chips 2200. Each of the semiconductor chips 2200 may include the semiconductor device according to any one of the embodiments described above with reference to FIGS. 1 to 23. For example, each of the semiconductor chips 2200 may include vertical memory structures 3220, which may correspond to the first and second vertical memory structures VS1 and VS2, described above, and separation structures 3210, which may correspond to the separation structures WLC, described above.

Each of the first and second semiconductor packages 2003a and 2003b may include a package substrate 2100, semiconductor chips 2200 on the package substrate 2100, adhesive layers 2300 disposed on a lower surface of each of the semiconductor chips 2200, a connection structure 2400 electrically connecting each of the semiconductor chips 2200 and the package substrate 2100, and a molding layer 2500 covering the semiconductor chips 2200 and the connection structure 2400 on the package substrate 2100.

The package substrate 2100 may be a printed circuit board including package upper pads 2130. Each of the semiconductor chips 2200 may include an input/output pad 2210. In example embodiments, the connection structure 2400 may be a bonding wire electrically connecting the input/output pad 2210 and the package upper pads 2130. Therefore, in each of the first and second semiconductor packages 2003a and 2003b, the semiconductor chips 2200 may be electrically connected to each other by a bonding wire process, and may be electrically connected to the package upper pads 2130 of the package substrate 2100.

In other example embodiments, in each of the first and second semiconductor packages 2003a and 2003b, the semiconductor chips 2200 may be electrically connected to each other by a connection structure including a through silicon via (TSV), instead of a connection structure 2400 by a bonding wire process.

In example embodiments, the controller 2002 and the semiconductor chips 2200 may be included in one (1) package. In an example embodiment, the controller 2002 and the semiconductor chips 2200 may be mounted on a separate interposer substrate, different from the main substrate 2001, and the controller 2002 and the semiconductor chips 2200 may be connected to each other by a wiring formed on the interposer substrate.

As described above, a semiconductor device according to an example embodiment may include common word lines disposed throughout a first memory region and a second memory region, and may further include individual word lines disposed in each of the first and second memory regions, as well as individual pass transistors electrically connected to the individual word lines, respectively, and common pass transistors electrically connected to the common word lines, respectively. By providing the common pass transistors in this manner, an overall area occupied by the pass transistors, in plan view, may be reduced, and thus a degree of integration of the semiconductor device may be improved.

As described above, embodiments may provide a semiconductor device capable of improving a degree of integration, and a data storage system including the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a first structure having a first memory region, a second memory region, and an extension region between the first memory region and the second memory regions, the first structure including word lines spaced apart from each other; and
a second structure having a circuit region overlapping the extension region in a vertical direction perpendicular to an upper surface of the second structure,
wherein:
the word lines include a first common word line and a second common word lines disposed at different height levels relative to the upper surface of the second structure, and a first intermediate individual word line and a second intermediate individual word lines disposed at a first same height level relative to the upper surface of the second structure and spaced apart from each other,
each of the first common word line and the second common word line is disposed in the first memory region, the extension region, and the second memory region,
the first intermediate individual word line is disposed in the first memory region and extends into the extension region, wherein the first intermediate individual word line is disposed at a height level that is between the different height levels of the first common word line and the second common word line,
the second intermediate individual word line is disposed in the second memory region and extends into the extension region,
the circuit region includes pass transistors electrically connected to the word lines,
the pass transistors include common transistors and individual transistors, and
at least one of the common transistors and at least one of the individual transistors overlap the word lines in the extension region.

2. The semiconductor device as claimed in claim 1, wherein:
each of the individual transistors includes a first impurity region, a second impurity region, a first channel region between the first impurity region and the second impurity regions, and a first gate on the first channel region, and
each of the common transistors includes a third impurity region and a fourth impurity region, a second channel region between the third impurity region and the fourth impurity regions, and a second gate on the second channel region.

3. The semiconductor device as claimed in claim 2, wherein:
the first channel region has a first channel width,
the second channel region has a second channel width, and
the second channel width is greater than the first channel width.

4. The semiconductor device as claimed in claim 1, wherein:
the first common word line and the second common word lines are electrically connected to the common transistors, respectively, and
the first intermediate individual word line and the second intermediate individual word lines are electrically connected to the individual transistors, respectively.

5. The semiconductor device as claimed in claim 1, wherein:
the word lines further include a first upper individual word line and a second upper individual word line, wherein the first upper individual word line and the second upper individual word line are disposed at a second same height level relative to the upper surface of the second structure and are spaced apart from each other, and are disposed at a height level higher than the second common word line, the second same height level being different from the first same height level,
the first upper individual word line is disposed in the first memory region and extends into the extension region, and
the second upper individual word line is disposed in the second memory region and extends into the extension region.

6. The semiconductor device as claimed in claim 5, wherein the first structure further includes:
- a first vertical memory structure penetrating through the first common word line, the first intermediate individual word line, the second common word line, and the first upper individual word line in the first memory region; and
- a second vertical memory structure penetrating through the first common word line, the second intermediate individual word line, the second common word line, and the second upper individual word line in the second memory region.

7. The semiconductor device as claimed in claim 6, further comprising:
- a first bit line disposed on the first vertical memory structure and electrically connected to the first vertical memory structure;
- a second bit line disposed on the second vertical memory structure and electrically connected to the second vertical memory structure;
- a first common contact plug contacting the first common word line in the extension region;
- a second common contact plug contacting the second common word line in the extension region;
- a first intermediate individual contact plug contacting the first intermediate individual word line in the extension region;
- a second intermediate individual contact plug contacting the second intermediate individual word line in the extension region;
- a first upper individual contact plug contacting the first upper individual word line in the extension region; and
- a second upper individual contact plug contacting the second upper individual word line in the extension region.

8. The semiconductor device as claimed in claim 7, wherein:
- a distance between the first vertical memory structure and the first common contact plug is greater than a distance between the first vertical memory structure and the first intermediate individual contact plug, and
- a distance between the first vertical memory structure and the second common contact plug is smaller than the distance between the first vertical memory structure and the first intermediate individual contact plug.

9. The semiconductor device as claimed in claim 7, wherein:
- a distance between the first vertical memory structure and the first common contact plug is greater than a distance between the first vertical memory structure and the first intermediate individual contact plug,
- a distance between the first vertical memory structure and the second common contact plug is greater than the distance between the first vertical memory structure and the first intermediate individual contact plug, and
- the distance between the first vertical memory structure and the first common contact plug is greater than the distance between the first vertical memory structure and the second common contact plug.

10. The semiconductor device as claimed in claim 1, wherein the first structure is disposed on the second structure.

11. The semiconductor device as claimed in claim 1, wherein the first structure is disposed below the second structure.

12. A semiconductor device, comprising:
- a first structure having a first memory region, a second memory region, and an extension region between the first and second memory regions; and
- a second structure including a circuit region overlapping the extension region in a vertical direction perpendicular to an upper surface of the second structure, wherein:
- the first structure includes:
- first lower common gate electrodes disposed in the first memory region and the second memory regions and the extension region, and spaced apart from each other in the vertical direction;
- first intermediate individual gate electrodes disposed in the first memory region, extending into the extension region, disposed at a first higher level, relative to the upper surface of the second structure, than the first lower common gate electrodes, and spaced apart from each other in the vertical direction;
- second intermediate individual gate electrodes disposed in the second memory region, extending into the extension region, disposed at the same height level, relative to the upper surface of the second structure, as the first intermediate individual gate electrodes, and spaced apart from the first intermediate individual gate electrodes in the extension region;
- first upper common gate electrodes disposed in the first memory region and the second memory regions and the extension region, and spaced apart from each other in the vertical direction;
- first upper individual gate electrodes disposed in the first memory region, extending into the extension region, disposed at a second higher level, relative to the upper surface of the second structure, than the first upper common gate electrodes, and spaced apart from each other in the vertical direction, the second higher level being different from the first higher level;
- second upper individual gate electrodes disposed in the second memory region, extending into the extension region, disposed at the same height level, relative to the upper surface of the second structure, as the first upper individual gate electrodes, and spaced apart from each other in the vertical direction;
- a first vertical memory structure passing through the first lower common gate electrodes, the first intermediate individual gate electrodes, the first upper common gate electrodes, and the first upper individual gate electrodes in the first memory region; and
- a second vertical memory structure passing through the first lower common gate electrodes, the second intermediate individual gate electrodes, the first upper common gate electrodes, and the second upper individual gate electrodes in the second memory region,
- the first structure includes a plurality of pad regions spaced apart from each other,
- at least one of the plurality of pad regions has a step shape lowering gradually and then rising gradually in a direction from the first memory region toward the second memory region, and
- the plurality of pad regions include a first lower common pad region including pads of the first lower common gate electrodes, a first intermediate individual pad region including pads of the first intermediate individual gate electrodes, a first upper common pad region including pads of the first upper common gate electrodes, and a first upper individual pad region including pads of the first upper individual gate electrodes.

13. The semiconductor device as claimed in claim 12, wherein:
a distance between the first vertical memory structure and the first lower common pad region is greater than a distance between the first vertical memory structure and the first intermediate individual pad region, and
the distance between the first vertical memory structure and the first intermediate individual pad region is greater than a distance between the first vertical memory structure and the first upper common pad region.

14. The semiconductor device as claimed in claim 12, wherein:
a distance between the first vertical memory structure and the first lower common pad region is greater than a distance between the first vertical memory structure and the first intermediate individual pad region,
the distance between the first vertical memory structure and the first intermediate individual pad region is smaller than a distance between the first vertical memory structure and the first upper common pad region, and
the distance between the first vertical memory structure and the first lower common pad region is greater than the distance between the first vertical memory structure and the first upper common pad region.

15. The semiconductor device as claimed in claim 12, wherein the first structure is disposed on the second structure.

16. The semiconductor device as claimed in claim 12, wherein the first structure is disposed below the second structure.

17. The semiconductor device as claimed in claim 12, wherein:
the circuit region includes pass transistors including common transistors and individual transistors,
the first lower common gate electrodes and the first upper common gate electrodes are electrically connected to the common transistors, respectively, and
the first intermediate individual gate electrodes, the second intermediate individual gate electrodes, the first upper individual gate electrodes, and the second upper individual gate electrodes are electrically connected to the individual transistors, respectively.

18. The semiconductor device as claimed in claim 17, wherein:
each of the individual transistors includes a first impurity region, a second impurity region, a first channel region between the first impurity region and the second impurity regions, and a first gate on the first channel region,
each of the common transistors includes a third impurity region and a fourth impurity region, a second channel region between the third impurity region and the fourth impurity regions, and a second gate on the second channel region, and
a channel width of the second channel region is greater than a channel width of the first channel region.

19. A data storage system, comprising:
a semiconductor device including an input/output pad; and
a controller electrically connected to the semiconductor device through the input/output pad, and configured to control the semiconductor device, wherein:
the semiconductor device includes:
a first structure having a first memory region, a second memory region, and an extension region between the first memory region and the second memory regions, the first structure including word lines spaced apart from each other; and
a second structure having a circuit region overlapping the extension region in a vertical direction perpendicular to an upper surface of the second structure,
the word lines include a first common word line and a second common word lines disposed at different height levels relative to the upper surface of the second structure, and a first intermediate individual word line and a second intermediate individual word lines disposed at a same height level relative to the upper surface of the second structure and spaced apart from each other,
each of the first common word line and the second common word line is disposed in the first memory region, the extension region, and the second memory region,
the first intermediate individual word line is disposed in the first memory region and extends into the extension region, wherein the first intermediate individual word line is disposed at a height level between the different height levels of the first common word line and the second common word line,
the second intermediate individual word line is disposed in the second memory region and extends into the extension region,
the circuit region includes pass transistors electrically connected to the word lines,
the pass transistors include common transistors and individual transistors, and
at least one of the common transistors and at least one of the individual transistors overlap the word lines in the extension region.

20. The data storage system as claimed in claim 19, wherein:
the first common word line and the second common word line are electrically connected to the common transistors, respectively,
the first intermediate individual word line and the second intermediate individual word lines are electrically connected to the individual transistors, respectively,
each of the individual transistors includes a first impurity region, a second impurity region, a first channel region between the first impurity region and the second impurity regions, and a first gate on the first channel region,
each of the common transistors includes a third impurity region and a fourth impurity region, a second channel region between the third impurity region and the fourth impurity regions, and a second gate on the second channel region, and
a channel width of the second channel region is larger than a channel width of the first channel region.

* * * * *